US010838003B2

(12) United States Patent
Chakrabarty et al.

(10) Patent No.: US 10,838,003 B2
(45) Date of Patent: Nov. 17, 2020

(54) MULTI-LAYER INTEGRATED CIRCUITS HAVING ISOLATION CELLS FOR LAYER TESTING AND RELATED METHODS

(71) Applicant: Duke University, Durham, NC (US)

(72) Inventors: Krishnendu Chakrabarty, Durham, NC (US); Ran Wang, Durham, NC (US)

(73) Assignee: Duke University, Durham, NC (US)

(*) Notice: Subject to any disclaimer, the term of this patent is extended or adjusted under 35 U.S.C. 154(b) by 0 days.

(21) Appl. No.: 16/442,920

(22) Filed: Jun. 17, 2019

(65) Prior Publication Data
US 2019/0302179 A1    Oct. 3, 2019

Related U.S. Application Data

(63) Continuation-in-part of application No. 15/497,389, filed on Apr. 26, 2017, now Pat. No. 10,338,133.
(Continued)

(51) Int. Cl.
*G01R 31/3187*       (2006.01)
*G01R 31/26*         (2020.01)
(Continued)

(52) U.S. Cl.
CPC ..... *G01R 31/2884* (2013.01); *G01R 31/2853* (2013.01); *H01L 23/5383* (2013.01); *H01L 29/0642* (2013.01)

(58) Field of Classification Search
CPC ............ G01R 31/2853; G01R 31/2882; G01R 31/2884; H01L 23/5226; H01L 23/5256;
(Continued)

(56) References Cited

U.S. PATENT DOCUMENTS 7,880,491 B2 *  2/2011  Hirose ............... H01L 22/32
                                              324/750.3
9,524,922 B2 * 12/2016  Lim ................. H01L 22/14
(Continued)

OTHER PUBLICATIONS

A. Topol et al., "Enabling SOI-Based Assembly Technology for Three-Dimensional (3D) Integrated Circuits (ICs)," in IEEE InternationalElectron Devices Meeting (IEDM), pp. 352-355, 2005.
(Continued)

*Primary Examiner* — Minh N Tang
(74) *Attorney, Agent, or Firm* — Olive Law Group, PLLC

(57) ABSTRACT

Multi-layer integrated circuits having isolation cells for layer testing and related methods are disclosed. According to an aspect, an integrated circuit includes multiple isolation cells. Example isolation cells include, but are not limited to, electronic fuses and tri-state flip-flops. The integrated circuit also includes a first layer having first and second sets of electronic components, the first set of electronic components being operatively connected to the second set of electronic components via the isolation cells. Further, the integrated circuit includes multiple transmission gates associated with the isolation cells. The integrated circuit also includes a second layer having electrical circuitry operatively connected to the electronic components of the first layer. The electrical circuitry is configured to apply test patterns to the electronic components of the first layer. Further, the electrical circuitry is configured to receive test responses from the electronic components of the first layer through the vias.

20 Claims, 18 Drawing Sheets

Related U.S. Application Data

(60) Provisional application No. 62/340,714, filed on May 24, 2016.

(51) Int. Cl.
  *G01R 31/28* (2006.01)
  *H01L 29/06* (2006.01)
  *H01L 23/538* (2006.01)

(58) Field of Classification Search
  CPC ............ H01L 23/5283; H01L 23/5383; H01L 24/14; H01L 24/16; H01L 24/81; H01L 29/0642
  See application file for complete search history.

(56) References Cited

U.S. PATENT DOCUMENTS

| | | | |
|---|---|---|---|
| 9,588,174 B1* | 3/2017 | Robertazzi | G01R 31/3187 |
| 2012/0280231 A1* | 11/2012 | Ito | H01L 25/0657 257/48 |
| 2015/0077147 A1* | 3/2015 | Goel | G01R 31/318513 324/750.3 |

OTHER PUBLICATIONS

B. Noia and K. Chakrabarty, "Design-for-Test and Test OptimizationTechniques for TSV-based 3D Stacked ICs," Springer, 2014.
C. Kothandaraman et al., "Electrically Programmable Fuse (eFUSE)Using Electromigration in Silicides," IEEE Electron Device Letters,vol. 23, pp. 523-525, Sep. 2002.
C. Yu et al., "TSV Process Optimization for Reduced Device Impact on28nm CMOS," in IEEE Symp. on VLSI Technology, pp. 138-139, 2011.
C.-C. Chi et al., "Post-bond Testing of 2.5D-SICs and 3D-SICs Con-taining a Passive Silicon Interposer Base," IEEE Int. Test Conf., 2011.
D. H. Kim et al., "A Study of Through-Silicon-Via Impact on the3D Stacked IC Layout," in Proceedings of International Conference onComputer-Aided Design, pp. 674-680, 2009.
D. H. Kim et al., "Block-Level 3D IC Design with Through-Silicon-ViaPlanning," in ASP-DAC, 2012.
E. J. Marinissen et al., "A Set of Benchmarks for Modular Testing ofSOCs," in IEEE Internation Test Conference, 2002.
H. Suto et al., "Systematic Study of the Dopant-Dependent Properties of Electrically Programmable Fuses With Silicided Poly-Si Links Through a Series of I-V Measurements," IEEE Transactions on Device and Materials Reliability, vol. 7, pp. 285-297, Jun. 2007.
H. Takaoka et al., "A Novel Via-fuse Technology Featuring HighlyStable Blow Operation with Large On-off Ratio for 32nm Node andBeyond," in IEEE International Electron Devices Meeting, 2007.
J. Munkres, "Algorithms for the Assignment and Transportation Problems," J. Society for Industrial and Applied Mathematics, 1957.
J.-H. Chien et al., "Contactless Stacked-die Testing for Pre-bond Inter-posers," in IEEE Design Automation Conference (DAC), 2014.
K. Kumagai et al., "A Silicon Interposer BGA Package with Cu-filled TSV and Multi-layer Cu-plating Interconnect," IEEE Electronic Components and Technology Conference, 2008.
K. S.-M. Li et al., "Optimized Pre-bond Test Methodology for Silicon Interposer Testing," in IEEE ATS, pp. 13-18, 2014.
L.-R. Huang et al., "Oscillation-Based Prebond TSV Test," IEEE Trans. On Cad pp. 1440-1444, 2013.
Y.-J. Lee and S. K. Lim, "Ultrahigh Density Logic Designs UsingMonolithic 3-D Integration," IEEE Transactions on Computer-AidedDesign of Integrated Circuits and Systems, vol. 32, No. 12, 2013.
M. Vinet et al., "Monolithic 3D Integration: A Powerful Alternative toClassical 2D Scaling," in IEEE SOI-3D-Subthreshold MicroelectronicsTechnology Unified Conference (S3S), pp. 1-3, 2014.
Notice of Allowance issued in counterpart U.S. Appl. No. 15/497,389 dated Mar. 6, 2019.
P. Batude et al., "3-D Sequential Integration: A Key Enabling Technologyfor Heterogeneous Co-Integration of New Function with CMOS," IEEE J. Emerging and Selected Topics in Circuits and Systems, 2012.
P. Batude et al., "Advances in 3D CMOS Sequential Integration," inIEEE International Electron Devices Meeting (IEDM), pp. 1-4, 2009.
P. Batude et al., "Advances, Challenges and Opportunities in 3D CMOSSequential Integration," in IEDM, pp. 151-154, 2011.
R. Wang et al., "Pre-Bond Testing of the Silicon Interposer in 2.5DICs," accepted for publication at IEEE/ACM Date Conference, 2016.
Response to Restriction Requirement filed in counterpart U.S. Appl. No. 15/497,389 dated Jan. 9, 2019.
Restriction Requirement issued in counterpart U.S. Appl. No. 15/497,389 dated Jan. 4, 2019.
S. K. Goel and A. Mehta, "Circuit and Method for Monolithic StackedIntegrated Circuit Testing," Apr. 2015. U.S. Pat. No. 9,110,136.
S. Kannan et al., "Device Performance Analysis on 20nm Technology Thin Wafers in a 3D Package," in IEEE International Reliability Physics Symposium, 2015.
S.-Y. Huang et al., "At-Speed BIST for Interposer Wires Supporting On-the-Spot Diagnosis," Intl On-Line Test Symp., 2013.
T. Ueda et al., "A Novel Cu Electrical Fuse Structure and Blowing Scheme Utilizing Crack-assisted Mode for 90-45nm-node and beyond," in Symposium on VLSI Technology Digest of Technical Papers, 2006.
V. der Plas et al., "Design Issues and Considerations for Low-Cost 3-DTSV IC Technology," IEEE Journal of Solid-State Circuits, 2011.

* cited by examiner

MULTI-LAYER INTEGRATED CIRCUITS HAVING ISOLATION CELLS FOR LAYER TESTING AND RELATED METHODS

CROSS REFERENCE TO RELATED APPLICATIONS

This is a U.S. continuation-in-part (CIP) patent application and claims priority to U.S. Non-Provisional patent application Ser. No. 15/497,389, now U.S. Pat. No. 10,338,133, filed Apr. 26, 2017 and titled MULTI-LAYER INTEGRATED CIRCUITS HAVING ISOLATION CELLS FOR LAYER TESTING AND RELATED METHODS, which claims priority to U.S. Provisional Patent Application No. 62/340,714, filed May 24, 2016 and titled DESIGN-FOR-TEST SOLUTIONS FOR MONOLITHIC 3D INTEGRATED CIRCUITS, the disclosures of which are incorporated herein by reference in their entireties.

TECHNICAL FIELD

The presently disclosed subject matter relates to integrated circuits (ICs). Particularly, the presently disclosed subject matter relates to multi-layer integrated circuits having isolation cells for layer testing and related methods.

BACKGROUND

The semiconductor industry continues to be faced with market demand for integrated circuits (ICs) with added functionality and higher performance In an effort to reduce die footprint, integrate more transistors, and achieve higher performance, interconnect structures that can allow multi-tiered ICs are being actively studied. Breakthroughs in new levels of die-scale integration are being facilitated by advances in vertical interlayer interconnect technology. With this technology, referred to as three-dimensional (3D) integration, a traditional IC is divided into multiple layers, and these layers are connected by vertical interconnects.

In 3D ICs, through-silicon-vias (TSVs) are the most-commonly used interlayer interconnects. This technology has been transitioned to the marketplace. For example, the AMD Fiji chip includes multiple five-die stacks with TSVs running through them. TSV-based 3D ICs offer many benefits, e.g., shorter interconnects, less power consumption, and reduced die footprint. However, the keep-out-zone required for TSVs leads to significant area overhead. Moreover, the die alignment precision in TSV-based 3D integration is limited to 1 μm, which prevents further reduction of the 3D contact pitch. Finally, TSVs are subject to intrinsic mechanical stress.

In order to fully exploit the potential of 3D integration, monolithic 3D (M3D) technology is being advocated as an alternative to TSV-based 3D ICs. M3D integration involves sequential layer-by-layer fabrication. After the bottom layer is formed on a substrate, the top layer is fabricated over the bottom layer. The two layers are connected together using interlayer vias (ILVs), and external I/O pins can directly access both the bottom layer and the top layer. Since the top layer can be constructed over a thin silicon substrate of around 30 nm in thickness, ILVs are one to two orders of magnitude smaller than TSVs. In addition, extremely high alignment precision is achieved, e.g., in the range of 10 nanometers (nm).

In emerging M3D applications, such as 3D FPGAs and the sequential integration of sensors, the digital logic is fabricated on the bottom layer, and memory or silicon-based sensors are fabricated on the top layer. In addition, the most advanced technology node is used only for the bottom layer. For this reason, defects are more likely to occur in the bottom layer, hence this layer must be tested carefully in order to ensure effective defect screening. In TSV-based 3D ICs, especially for die-to-die integration, the bottom die can be tested before it is bonded to other dies. However, in monolithic 3D ICs, the bottom layer cannot be tested until both layers are fabricated and I/O pads are available. It would be beneficial to provide the ability to test the bottom layer separately to enable defect isolation and yield enhancement.

BRIEF SUMMARY

Disclosed herein are multi-layer integrated circuits having isolation cells for layer testing and related methods. According to an aspect, an integrated circuit includes multiple isolation cells. Example isolation cells include, but are not limited to, electronic fuses and tri-state flip-flops. The integrated circuit also includes a first layer having first and second sets of electronic components, the first set of electronic components being operatively connected to the second set of electronic components via the isolation cells. Further, the integrated circuit includes multiple transmission gates associated with the isolation cells. The integrated circuit also includes a second layer having electrical circuitry operatively connected to the electronic components of the first layer by vias and the transmission gates. The electrical circuitry is configured to apply test patterns to the electronic components of the first layer through the vias and the transmission gates. Further, the electrical circuitry is configured to receive test responses from the electronic components of the first layer through the vias. The electrical circuitry is also configured to control the isolation cells and transmission gates in a predetermined sequence and coordinated with application of test patterns for localized testing of the first and second sets of electronic components.

BRIEF DESCRIPTION OF THE SEVERAL VIEWS OF THE DRAWINGS

The foregoing aspects and other features of the present subject matter are explained in the following description, taken in connection with the accompanying drawings, wherein.

DETAILED DESCRIPTION

For the purposes of promoting an understanding of the principles of the present disclosure, reference will now be made to various embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e., at least one) of the grammatical object of the article. By way of example, "an element" means at least one element and can include more than one element.

Unless otherwise defined, all technical terms used herein have the same meaning as commonly understood by one or ordinary skill in the art to which this disclosure belongs.

As referred to herein, the term "isolation cell" is any electronic component capable of providing an electrical connection between points in an electrical circuit and controllably breaking the electrical connection between the same points. Example isolation cells include, but are not limited to e-fuses and tri-state flip-flops.

As referred to herein, the term "integrated circuit" is an electronic circuit formed on semiconductor material and configured to perform electrical functions. The integrated circuit may include one or more electronic components connected together and made as will be understood by those of skill in the art. An integrated circuit may be an integrated circuit multiple layers as implemented by M3D technology.

Figure 1:
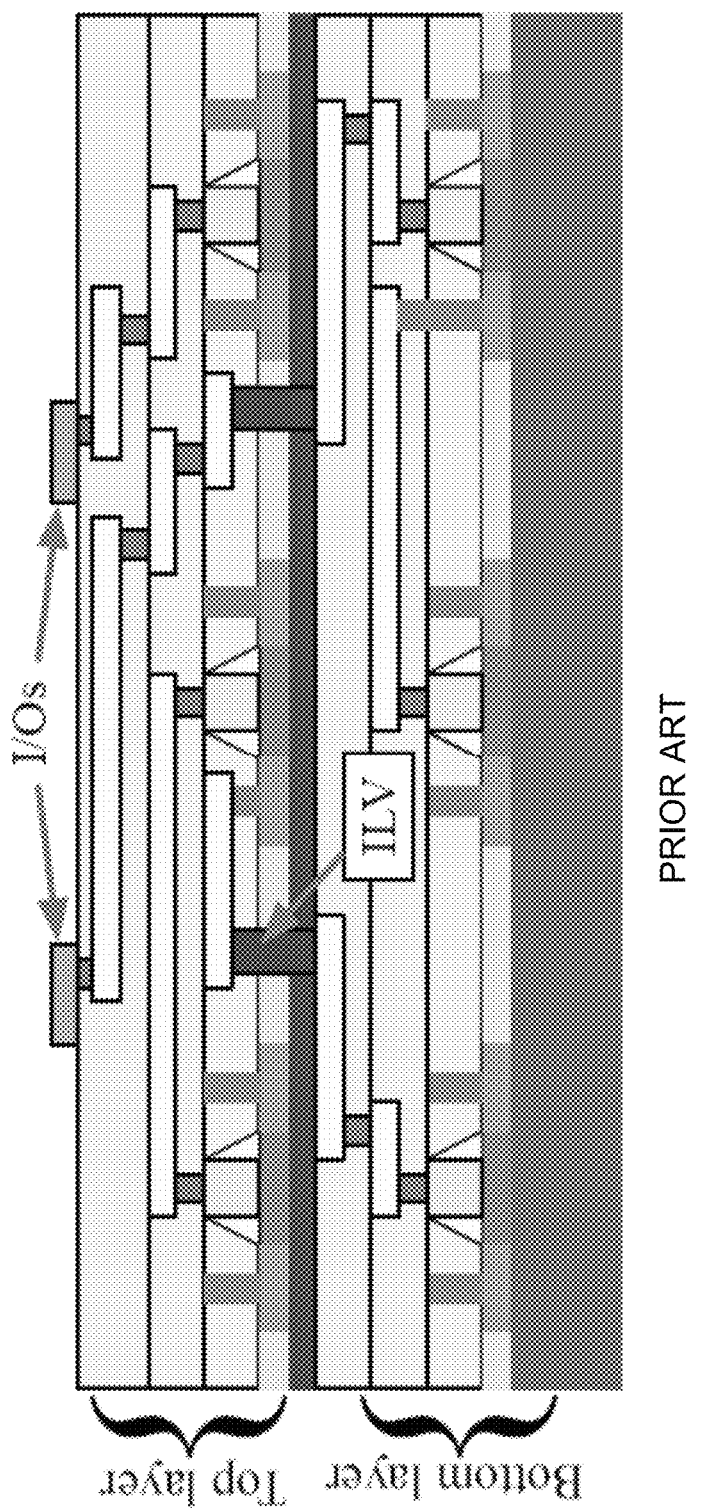
FIG. 1 is a side cross-sectional view of an example M3D IC in accordance with embodiments of the present disclosure.

In accordance with embodiments, systems and methods are disclosed for efficiently testing the bottom layer of M3D ICs. FIG. 1 illustrates a side cross-sectional view of an example M3D IC. Particularly, design-for-test (DfT) systems and methods are disclosed in which the bottom layer is isolated from the top layer using a bypass structure based on e-fuses. An e-fuse may be used to connect a pair of ILVs. In order to minimize the wire length between paired ILVs, an ILV pairing problem may be formulated and mapped to the maximum-weighted bipartite matching problem. Disclosed herein is a Munkres algorithm for solving the ILV pairing problem. The independent ILVs, i.e., those that are not paired, are made controllable and observable using four different types of DfT structures. A cost-optimization problem is solved to minimize the DfT cost. ILV-pairing and cost-optimization results are presented for designs based on the various benchmarks as well as for an industry design.

Figure 2A:
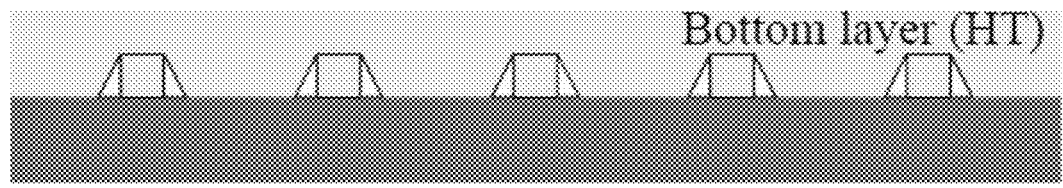
FIGS. 2A-2C are cross-sectional side views depicting a fabrication flow for monolithic 3D IC fabrication in accordance with embodiments of the present disclosure.
Figure 2B:
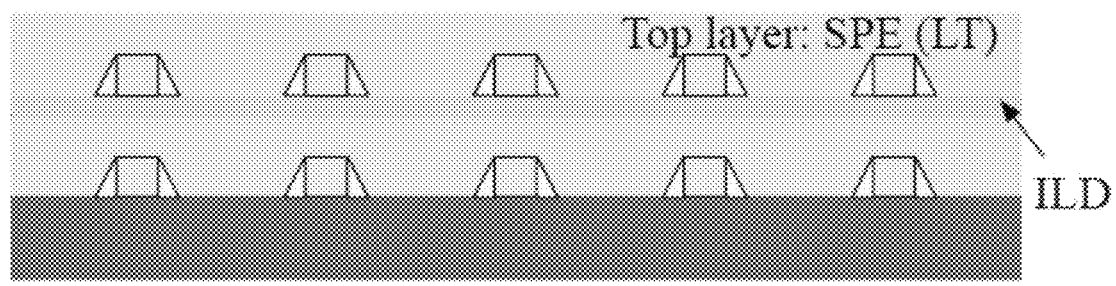
Figure 2C:
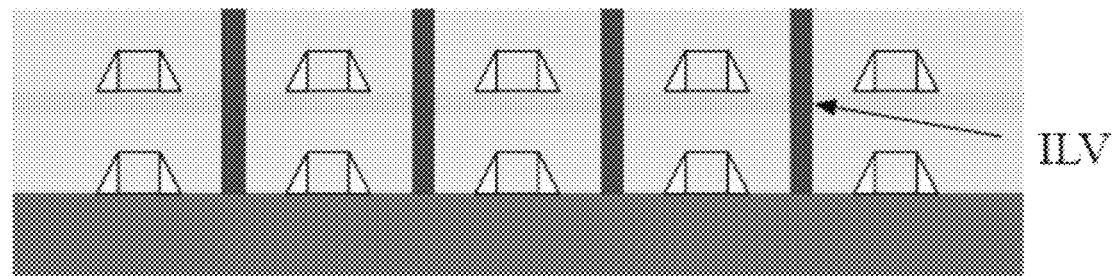

In M3D ICs, the top layer is fabricated on top of the bottom layer. A goal is to prevent damage to the bottom layer when the top layer is processed. For example, FIGS. 2A-2C illustrate cross-sectional side views depicting a fabrication flow for monolithic 3D IC fabrication. Referring to FIG. 2A, the bottom layer is first fabricated. Transistors on the bottom layer may be processed using the standard high-temperature budget. Subsequently, a thin interlayer dielectric (ILD) may be deposited and planarized on top of the bottom transistors. In order to avoid the degradation of the bottom transistors, the top layer may be processed using lower temperature, as shown in FIG. 2B. Low-temperature molecular bonding of the SOI substrate is used to obtain a high-quality active top layer. Solid-phase epitaxy (SPE) technology, which operates at 600 degrees C., may be used for dopant activation. Further, ILVs may be fabricated through the ILD to communicate between the two layers, as shown in FIG. 2C.

In fabrication flow shown in FIGS. 2A-2C, only the bottom layer is fabricated using an advanced technology node. On the other hand, since top-layer processing is based on a new fabrication technique, limited functionality is integrated on it, e.g., only memory or silicon-based sensors, to ensure that it can be fabricated using a less advanced node. As a result, defects are more likely to occur on the bottom layer. The testing of the bottom layer can enable defect isolation and help in identifying problems with the processing steps. Various such techniques have been developed. However, there are difficulties with efficiently and effectively testing the bottom layer.

In accordance with embodiments of the presently disclosed subject matter, efficient systems and methods are provided to test the bottom layer by isolating it from the top layer. The presently disclosed systems and methods may be used, for example for the type of M3D ICs that involve gate-level partitioning. Due to the high density of ILVs, M3D ICs can be based on either transistor-level partitioning (T-MI) or gate-level partitioning (G-MI). In T-MI, standard cells are divided into pMOS and nMOS parts, and these parts are placed in different layers. In G-MI, cells are placed in different layers. Only G-MI partitioning is disclosed herein, but it should be understood that the disclosed systems and methods may also be applied to other types. Even though a scan chain in an M3D IC can be placed in two different layers, it is assumed herein for simplicity of description, and without loss of generality, that a scan chain may be placed in one layer. Since ILVs are similar in size to the local metal vias used in each layer, they may be fabricated using the same lithography process as these vias.

As a result, a low defect rate can be assumed for ILVs and they can be tested using a suitable technique.

In M3D ICs for example, two layers may be sequentially fabricated. As a result, the bottom layer can only be tested once the complete M3D IC is fabricated. In order to test the bottom layer, the top layer may be isolated from the bottom layer. In other words, when the bottom layer is under test, no signals from the top layer can be transmitted to the bottom layer; the signals to the bottom layer can only be transmitted from the bottom layer itself or from outside the M3D ICs via I/O pads. Note that signals between two layers are transmitted through ILVs. Therefore, these ILVs can be bypassed so that signals from the top layer do not affect the testing of the bottom layer. With high-density ILVs, the bypass structure may need to be compatible with high-density integration and also involve low area overhead. Herein, a bypass structure is described and an algorithm is developed to pair ILVs using bypass structures.

Figure 3:
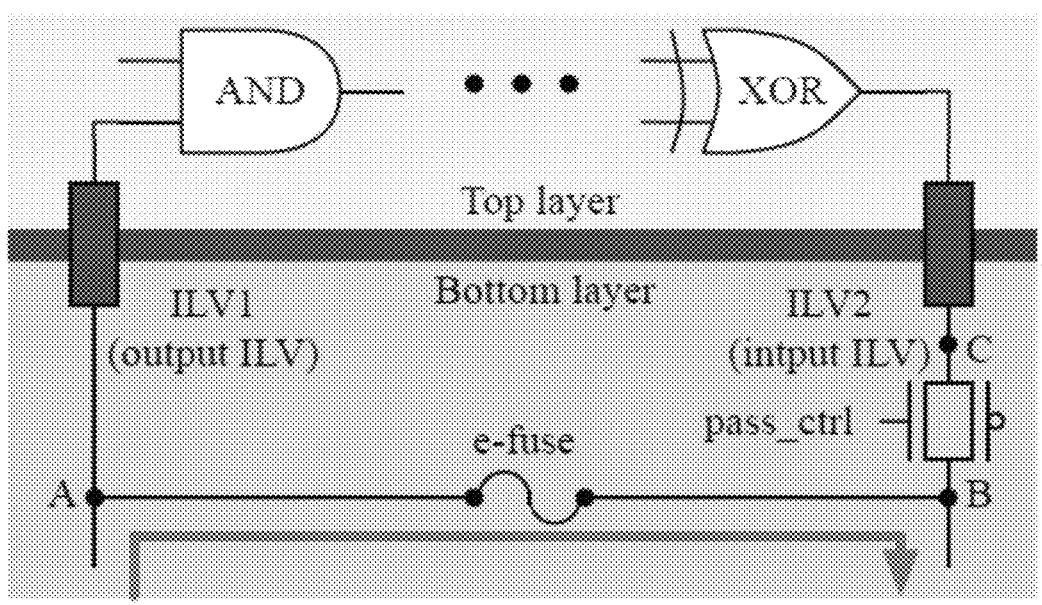
FIG. 3 illustrates a schematic diagram of an example bypass structure in accordance with embodiments of the present disclosure

In accordance with embodiments, FIG. 3 illustrates a schematic diagram of an example bypass structure. Referring to FIG. 3, the structure includes a transmission gate and an e-fuse as shown. The transmission gate may be controlled by the pass_ctrl signal to connect or disconnect points B and C. No additional I/O pad is needed in this example to control the pass_ctrl signal; it can be generated internally by decoding instructions from the IEEE 1149.1 Instruction Register, for example. The e-fuse is a programmable device and there are three kinds of e-fuses: (i) gate-electrode-fuse; (ii) Cu-fuse; (iii) via-fuse. Among them, the resistance of the Cu-fuse is as small as 25Ω before programming and several GΩ after programming. The low on-off resistance ratio of the Cu-fuse can make it a suitable candidate to connect or disconnect points A and B. A similar e-fuse structure has been utilized recently to test passive interposers in 2.5D ICs.

From the bottom layer's perspective, all ILVs are either inputs or outputs to the bottom layer, and they can be referred to as input ILVs or output ILVs, respectively. Since no signals on the top layer are allowed to be transmitted to the bottom layer, the transmission gate is connected to the input ILV (ILV2 in FIG. 3) of the bottom layer. Point B can only receive signals from the bottom layer. Thus, point A is connected to the output ILV (ILV1 in FIG. 3). Hence, it is noted that the bypass structure can only be connected between an input ILV and an output ILV. When the bottom layer is under test, the pass ctrl signal is set to 0 and no signals are received from the top layer; instead, signals are transferred from point A to B. Afterwards, the e-fuse is programmed to be an open circuit, and the pass ctrl signal is set to 1. With these settings, the M3D IC may be operated in functional mode. In the bypass structure, each pair of ILVs requires only one transmission gate. With up to a few thousand of ILVs anticipated in M3D designs, the bypass structure introduces only a few thousand gates. Therefore, the area overhead of the bypass structure is negligible in a design with billions of gates.

The position of each ILV must be known in order to pair ILVs using bypass structures. Since the bypass structure must be connected between an input ILV and an output ILV, only the position relationship between input ILVs and output ILVs need to be analyzed. This relationship can be characterized by a distance matrix $W=[w_{ij}]$, where each element $w_{ij}$ represents the distance between input ILV i and output ILV j. Therefore, all non-diagonal elements in $w_{ij}$ are nonzero. If the number of input ILVs is not equal to that of output ILVs, W is a non-square (rectangular) matrix.

Figure 4:
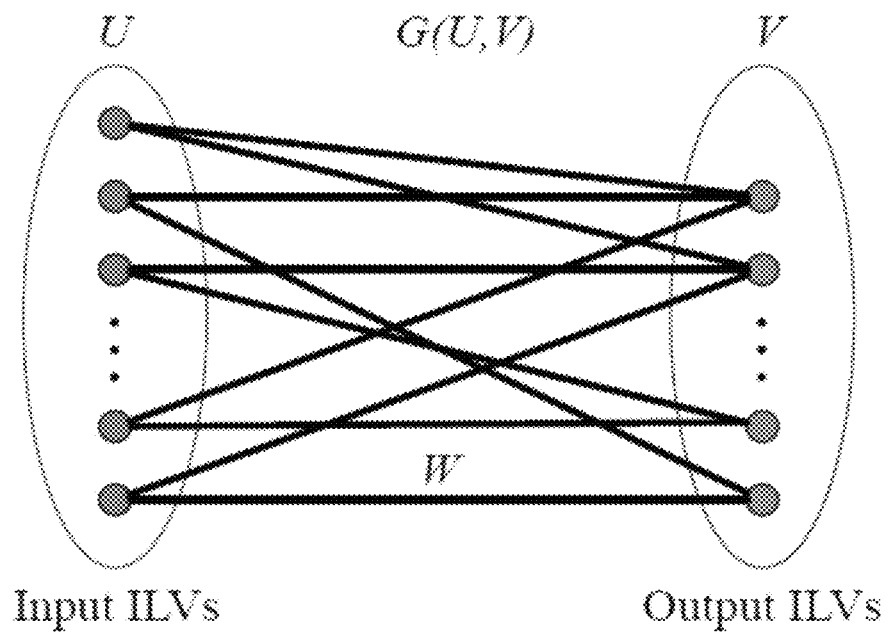
FIG. 4 is a bipartite graph G(U, V) for pairing ILVs.

Once the distance matrix is generated, it can be mapped to a bipartite graph G, as shown in FIG. 4. The set of ILVs can be partitioned into two disjoint sets U and V, where U contains all the input ILVs and V contains all of the output ILVs. Each element in W represents the weight of an edge between a vertex in U and a vertex in V. In this way, the ILV pairing problem is mapped to a bipartite matching problem. The goal of bipartite matching is to find a set of pairwise non-adjacent edges in the bipartite graph. Each edge has one vertex in set U and the other vertex in set V. No two edges in a bipartite matching share a common vertex. In order to minimize the area overhead, the sum of edges weights for a bipartite matching can be minimized A set of pairwise ILVs in the matching is referred to as paired ILVs. In order to avoid signal degradation caused by long interconnects, the distance between two paired ILVs should not greater than a specified threshold (thd).

The ILV pairing problem can thus be formally defined as follows. In this example, an M3D IC with two layers is given. The number of input ILVs is equal to 1, and the number of output ILVs is equal to J. The distance between input ILV i and output ILV j is equal to $w_{ij}$ and the threshold is thd. Our goal is to find a bipartite matching such that the sum of $w_{ij}$ in the matching is minimized while the distance between any two paired ILVs is not greater than thd.

In order to obtain a matching, the input ILV set U may be balanced with the output ILV set V if the number of input ILVs (I) is not equal to the number of output ILVs (J). This can be achieved by adding dummy vertices, which can transform the non-square matrix W to a square matrix. In the square matrix, the distances between dummy vertices and real vertices may all be set to a large value A, where A is greater than $\max_{i,j}\{w_{ij}\}$. Then, this problem can be viewed as a maximum-weighted bipartite matching. The minimization problem can be transformed to a maximization problem by subtracting all elements in W from a large value B that is greater than A. This new matrix is referred to as W'. The maximum-weighted bipartite matching problem can be solved using Munkres algorithm, for example. In the following, some terminology is introduced that is used in the rest of this disclosure.

As referred to herein, the term "weighted cover" (a, b) is a choice of labels $a_1, \ldots, a_n$ and $b_1, \ldots, b_n$ such that $a_i+b_j \geq w_{ij}'$ for all i, j.

As referred to herein, the term "equality subgraph" $(G_{a,b})$ for a weighted cover (a, b) is the spanning subgraph of the bipartite graph G. For any edge in $G_{a,b}$, $a_i+b_j=w_{ij}'$.

As referred to herein, the term "perfect matching" is a matching that matches all vertices for the graph. In other words, all vertices in the graph are included in the matching.

Based on the terminology defined above, the objective of the Munkres algorithm is to iteratively adjust a weighted cover (a, b) until the equality subgraph $G_{a,b}$ of G has a perfect matching. Once the Munkres algorithm generates the results for the maximum-weighted bipartite matching, some additional steps beyond the Munkres algorithm are needed for our optimization problem. All edge weights $w_{ij}'$ in the matching are subtracted from B in order to obtain the real distance for the ILV assignment. If wij is equal to A, a real vertex is paired with a dummy vertex. In this case, the ILV must be eliminated from the pairing results. If $w_{ij}$ is less than A, two real vertices are paired. If $w_{ij}$ is smaller than thd for these ILVs, they are identified as paired ILVs. Otherwise, since the distance between two paired ILVs cannot be greater than thd, these ILVs can be re-paired. Although the paired results produce a minimum global distance, the re-paired results may generate new paired ILVs. Once the paired ILVs are identified, the remaining ILVs are taken as the independent ILVs. The pseudo-code of the optimization technique is shown in the following algorithm.

---
Algorithm 1 [ILV Assignment (G(U, V), W, thd)]
---

Let $\alpha_i = \max\{w_{ij}' : j = 1, ..., n\}$ and $b_j = 0$;
Form the equality subgraph $G_{a,b}$ for G:
Find a maximum matching M in $G_{a,b}$;
While M is not a perfect matching {
    Find vertex cover Q of size |M| in $G_{a,b}$:
    R = U ∩ Q; T = V ∩ Q;
    ∈ = min{$a_i + b_j - w_{ij}'$: $u_i \in$ U \ R, $v_j \in$ V \ T}:
    Update a and b {
        $a_i = a_i - \in \forall u_i \in$ U \ R; $b_j = b_j + \in \forall v_j \in$ T; } }
For each $w_{ij}'$ in M { $w_{ij} = B - w_{ij}'$; If $w_{ij} = A$ {
    Remove dummy vertex (suppose it is ILV i);
    Set ILV j as an independent ILV; }
    Else if $w_{ij}$ < A {
        If $w_{ij}$ ≤ thd {
            Set ILV i and ILV j as paired ILVs; }
        Else {
            Create set H and put rest ILVs in set H; } } },
For each $u_i$ and $v_j$ in H {
    If $w_{ij}$ ≤ thd {
        Set ILV i and ILV j as paired ILVs;
        Remove $u_i$ and $v_j$ from H; } }
Set all ILVs remaining in H as independent ILVs;
Return Assignment results.

---

After the paired ILVs are identified, the remaining ILVs are deemed to be independent ILVs. Because of the unequal number of input and output ILVs, some input or output ILVs cannot be paired with output or input ILVs. Moreover, if there are no available ILVs that can be paired within thd distance of an ILV, then this ILV is identified as an independent ILV. Although these independent ILVs cannot be connected by the bypass structure, they must be isolated from the bottom layer by some other DfT structures. In this example, four types of DfT structures are disclosed in order to observe or control signals to and from these independent ILVs. In addition, a cost function is presented to minimize the hardware cost.

If data is transferred from the bottom layer to the top layer through an independent ILV, then this ILV is an output ILV and these signals must be observed when the bottom layer is under test. Similarly, if data is transferred from the top layer to the bottom layer through an independent ILV, then this ILV is an input ILV and the signals from the other layer must be isolated. Instead of these signals, fully controllable signals should replace the original signals and be applied to the bottom layer from this input ILV. With this set-up, the independent ILVs can be connected to either outside I/O pads or to internal scan flip-flops (SFFs). This connectivity can be realized through either of four different DfT structures.

Figures 5A, 5B:
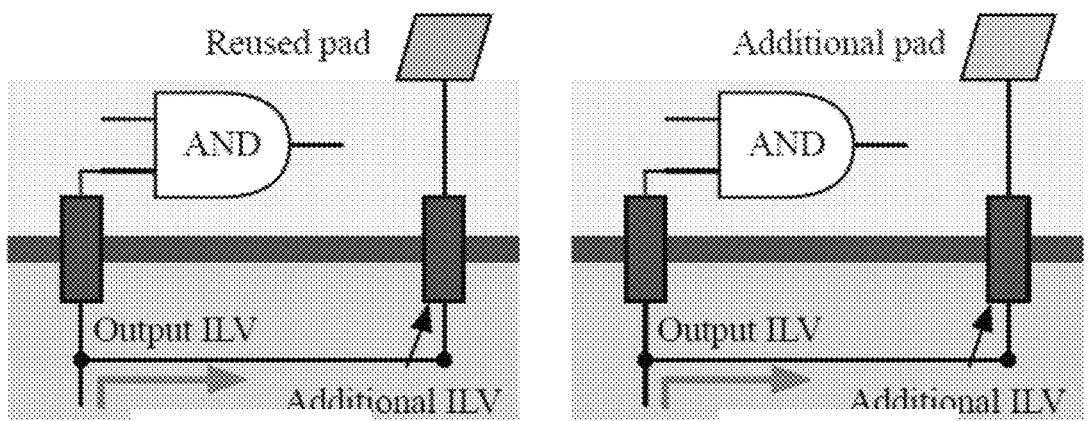
FIGS. 5A-5D are diagrams of example DfT structures.

The example DfT structures are shown in FIGS. 5A-5D. FIG. 5A and FIG. 5B illustrate DfT structures in which independent ILVs are connected to I/O pads. As a result, signals from the bottom layer can be directly observed. In FIG. 5A, an additional ILV is introduced and an I/O pad from the top layer is reused. Similarly, both an additional ILV and an additional I/O pad are introduced in FIG. 5B. Based on the usage of the I/O pad, the DfT structures in FIG. 5A and FIG. 5B are referred to as "Reused Pad" and "New Pad," respectively.

Figures 5C, 5D:
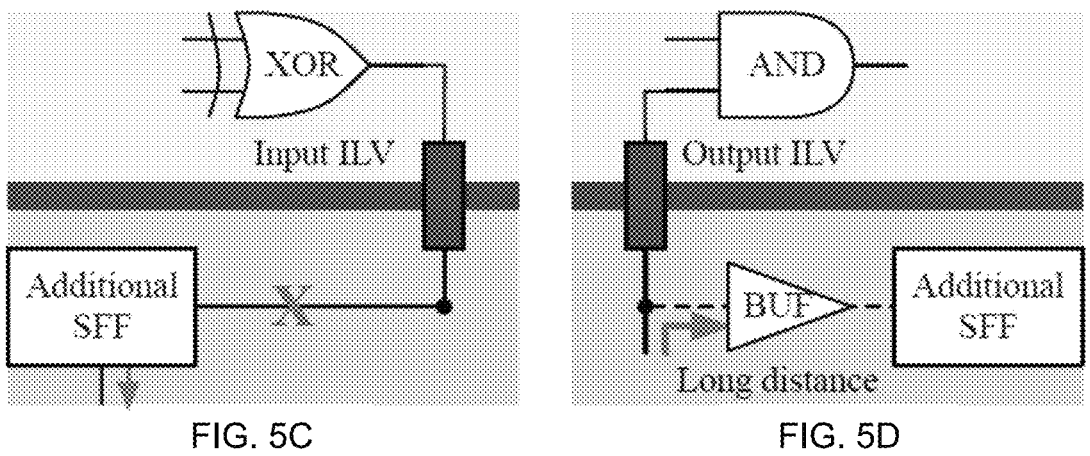

Note that the DfT structures in FIG. 5A and FIG. 5B can only be used for independent output ILVs. FIG. 5C and FIG. 5D illustrate more general DfT structures that use additional SFFs. An additional SFF can both launch and capture signals to and from the bottom layer depending on the directionality of the independent ILV. In FIG. 5C, the additional SFF is placed close to the corresponding independent ILV. This is in contrast to the DfT structure shown in FIG. 5D, which has the additional SFF placed far away from the corresponding independent ILV. As a result, an additional buffer (or multiple buffers as needed) is inserted between the independent ILV and the additional SFF. The DfT structures in FIG. 5C and FIG. 5D are referred to as "Local SFF" and "Distance SFF," respectively. Although an independent ILV can be equipped with one of those four DfT structures, it is determined which DfT structure may optimally be used for each independent ILV. The "Reused Pad" structure introduces the lowest hardware overhead but the number of reusable I/O pads is limited. The structure "New Pad" represents the most straightforward solution but it introduces the highest overhead. The number of possible "Local SFF" and "Distance SFF" structures is limited by the density of SFFs in the corresponding area. In order to minimize the hardware cost, we use integer linear programming (ILP) to provide the most efficient mix of the DfT structures. The parameters used for optimization are defined below.

For DfT structures "New Pad" and "Reused Pad," two binary variables xi and yi are defined. Variable $x_i$ is equal to 1 if independent ILV i is matched with "New_Pad," where 1≤i≤N. Otherwise, independent ILV i is matched with other DfT structures. Similarly, variable yi is equal to 1 if independent ILV i is matched with "Resused_Pad". Constraints on variables $x_i$ and $y_i$ are defined as follows:

$$x_i \leq I_i; y_i \leq I_i \forall i; \sum_{i=1}^{N} y_i \leq E; \tag{1}$$

$$\sum_{i=1}^{N} (x_i + y_i) \cdot L_{ik} + P_k \leq D_i, \forall k \tag{2}$$

The first two sets of constrains in (1) indicate that "New_Pad" and "Reused_Pad" can only be used for output ILVs. The third constraint in (1) limits the number of reused I/O pads to be no more than the total number of available I/O pads that can be reused. Constraint (2) limits the total number of ILVs in subarea k to be smaller than the maximum number of ILVs that can be in one subarea. It is noted that the bottom layer can be divided into several subareas. The utilization of the remaining two DfT structures, "Local_SFF" and "Distance_SFF," can be represented by a third binary variable, $z_{ik}$, which is equal to 1 if the independent ILV i is equipped with an additional SFF located in subarea k. Note that subarea k may not be the same subarea as that in which the ILV i is located. In that case, subarea k must be adjacent to the subarea in which the ILV i is located. This can be represented by Constraint (3) defined below:

$$\left( \sum_{h=1}^{K} (S_{hk} \cdot L_{ih}) + L_{ik} - 1 \right) \cdot z_{ik} \geq 0, \forall i, k \tag{3}$$

$$\sum_{i=1}^{N} z_{ik} + Q_k \leq D_k, \forall k \tag{4}$$

Constraint (4) limits the total number of SFFs in subarea k to be smaller than the maximum number of SFFs that can be on one subarea. The relationship between $x_i$, $y_i$, and $z_{ik}$ is defined below:

$$x_i + y_i + \sum_{k=1}^{K} z_{ik} = 1, \forall i \quad (5)$$

Constraint (5) ensures that each independent ILV is matched to one of the four DfT structures. With the variables defined above, the objective is to minimize the total hardware cost for the four DfT structures on the bottom layer, defined as follows:

$$\sum_{i=1}^{N} \sum_{k=1}^{K} \left[ \left( \sum_{h=1}^{K} S_{h,k} \cdot L_{ih} \right) \cdot z_{ik} \cdot C_1 \right] + \quad (6)$$

$$\sum_{i=1}^{N} \sum_{k=1}^{K} L_{ik} \cdot z_{ik} \cdot C_2 + \sum_{i=1}^{N} x_i \cdot C_3 + \sum_{i=1}^{N} y_i \cdot C_4$$

The parameters $C_1$, $C_2$, $C_3$, and $C_4$ are the hardware costs for "Distance_SFF," "Local_SFF," "New_Pad," and "Reused_Pad," respectively. The results for this ILP model may determine which DfT structure is used for each independent ILV.

Figure 5E:
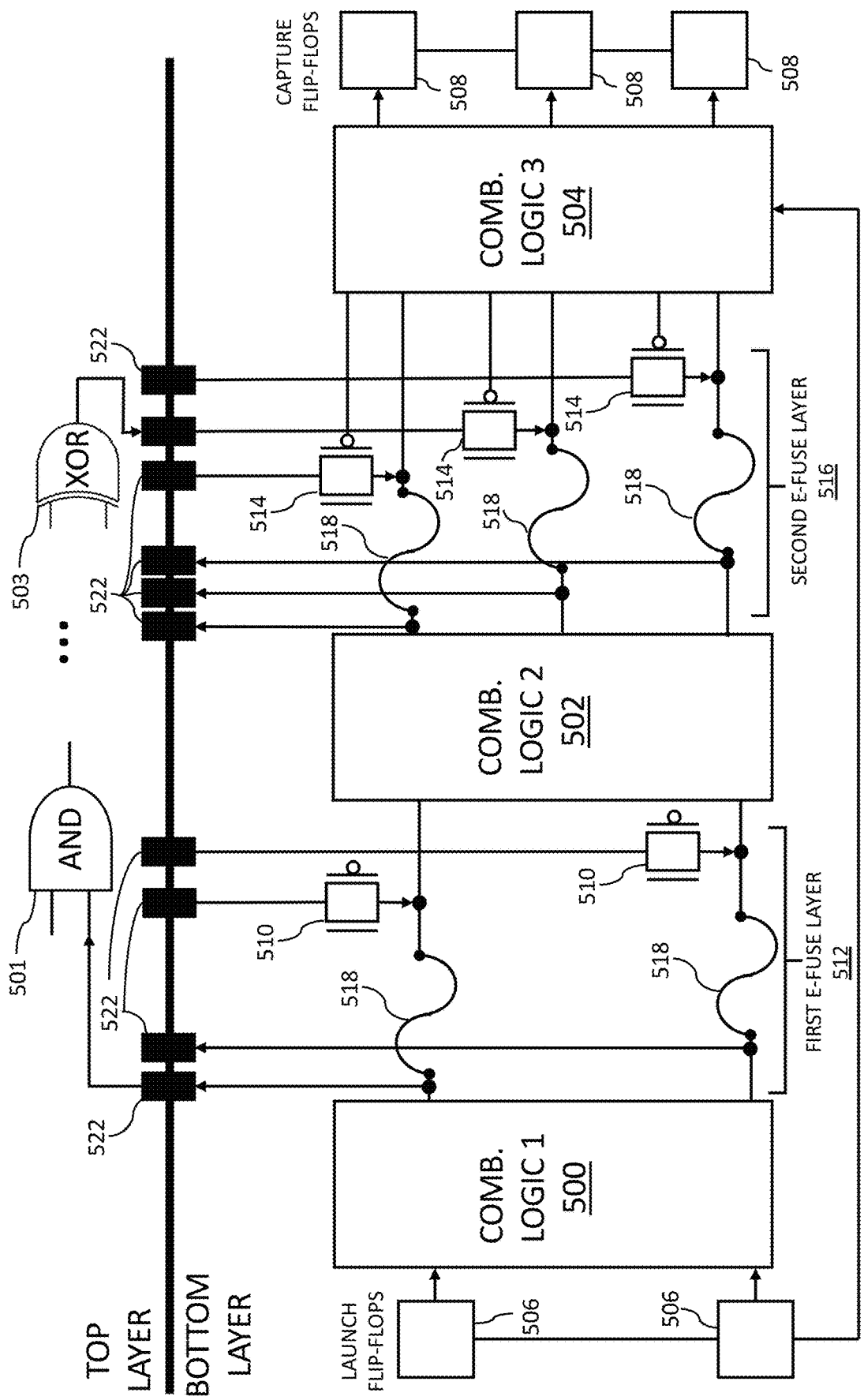
FIG. 5E is a diagram of portion of an example M3D IC for detection of fault localization and diagnosis in accordance with embodiments of the present disclosure.

In addition to detection of faults on a bottom layer of a M3D IC, systems and techniques are disclosed herein for fault localization and diagnosis. Particularly, after the bottom layer is isolated from the top layer in accordance with embodiments disclosed herein, the resulting system may be used for fault localization and diagnosis. For example, FIG. 5E illustrates a diagram of portion of an example M3D IC for detection of fault localization and diagnosis in accordance with embodiments of the present disclosure. Referring to FIG. 5E, combinational logic 1, 2, and 3, designated by reference numerals 500, 502, and 504, respectively, may be wrapped by launch scan flip-flops 506 and capture scan flip-flops 508. It is noted that for ease of illustration, only one scan chain is shown in FIG. 5E. Combinational logic may include, but is not limited to, logic components such as embedded cores, custom blocks for control, circuitry, glue logic, and the like. It is noted that alternative to the combinational logic, these components may be replaced by any number of suitable electronic components. Alternatively, the combinational logic may be any suitable electronic components With continuing reference to FIG. 5E, transmission gates 510 associated with a first e-fuse layer 512 and transmission gates 514 associated with a second e-fuse layer 516 are turned off so that the combinational logic 1 500, combinational logic 2 502, and combinational logic 3 504 are connected by e-fuses 518 of the first and second e-fuse layers 512 and 516 in the bottom layer. Test patterns may be shifted into scan chains and subsequently applied to the combinational logic. Test responses from the combinational logic may then be captured by scan flip-flops 508 and shifted out of scan chains. If there is any response mismatch, the mismatch can be mapped back to the specific scan flip-flop 508. It is noted that AND gate 501 and XOR gate 503 are representative of the combinational logic in the top layer in this example, although these components may be replaced with any other suitable electronic components residing in the top layer. ILVs 522 may provide connection between the top layer and the bottom layer. Before the first e-fuse layer 512 is programmed, combinational logic 2 502 is connected to combinational logic 1 500 through e-fuses 518. After first e-fuse layer 512 is programmed, combinational logic 2 502 is connected to the upper layer through ILVs 522.

In the example of FIG. 5E, e-fuses 518 may be categorized into different layers 512 and 514, and a logic cone can be divided into groups by the multiple layers of e-fuses 518. As shown in FIG. 5E, the combinational logic 500, 502, and 504 is divided into three groups by two layers 512 and 516 of e-fuses 518. The e-fuses 518 may be blown (i.e., programmed) sequentially. Therefore, if one layer of e-fuses 518 is programmed and the associated transmission gates 510 and 514 are switched on, the internal points can be directly accessed from the top layer. As a result, the controllability for the internal points of the logical cone can be increased.

In an example of fault localization, the first layer 512 of e-fuses 518 are first programmed. Since different e-fuses can be programmed using different programming currents, e-fuses can be programmed one by one. Therefore, the first layer 512 of e-fuses 518 can be programmed while the second layer 516 of e-fuses 518 remain connected. In an example, e-fuses can be programmed by passing a high current. Subsequently, the associated transmission gates 510 are switched on. Combinational logic 1 500 is disconnected from combinational logic 2 502. For example, after an e-fuse is programmed, it can change from being a low-resistance wire connection to a high-resistance element (in the Mega Ohms), hence leading to the disconnection. Combinational logic 2 500 is connected to the top layer through ILVs 122 and transmission gates 510 and 514.

Continuing the fault localization example, test patterns may be applied through ILVs 522 to internal points (i.e., input points) in combinational logic 2 502. If the fault is between launch flip-flops 506 and the blown e-fuses at the first e-fuse layer 512, the logic cone between the first e-fuse layer 512 and capture scan flip-flops 508 are fault-free, because test responses captured by scan flip-flops 508 match the expected values. For example, once test response data is captured in a scan flip-flop 508, it can be shifted out through a scan chain to an external tester. The tester can compare the observed response with an expected ("golden") response. Alternatively, on-chip response comparison can also be implemented, e.g., using a suitable built-in self-test methods.

In contrast, if the fault is between the first e-fuse layer 512 and capture scan flip-flops 508, the mismatches are captured by capture flip-flops 508. In this scenario, the logic cone between launch flip-flops 506 and the first e-fuse layer 512 can be excluded from fault localization if there is a match, or localized to be between launch flip-flops 506 and the first e-fuse layer 512 if there is a mismatch.

Subsequent to determining whether a fault is located between the first e-fuse layer 512 and the second e-fuse layer 514, the second e-fuse layer 514 is programmed, and the associated transmission gates 514 are switched on. Further, combinational logic 2 502 is disconnected from combinational logic 3 504. The combinational logic 3 504 is also connected to the top layer through ILVs 522 and transmission gates 514. Test patterns may be applied through ILVs 522 to internal points in combinational logic 3 504. If the fault is between launch flip-flops 506 and the blown e-fuses at the second e-fuse layer 514, the logic cone between the second e-fuse layer 514 and capture scan flip-flops 508 are fault-free, because test responses captured by scan flip-flops 508 match the expected values. In contrast, if the fault is between the second e-fuse layer 514 and capture scan flip-flops 508, the mismatches are captured by capture flip-flops 508. In this scenario, the logic cone between launch flip-flops 506 and the first e-fuse layer 514 can be excluded from fault localization if there is a match, or localized to be between launch flip-flops 506 and the first e-fuse layer 514 if there is a mismatch.

By this example, fault localization may be determined between logic cones of the first e-fuse layer 512 and the second e-fuse layer 516. In the case of more e-fuse layers, the subsequent e-fuse layers can be programmed sequentially until the fault is localized in one of the logic cones that is between two e-fuses layers in accordance with this example.

Now, simulation results are presented for the ILV pairing and cost-optimization problems. The example algorithm for ILV pairing provided herein is implemented using Python. The ILP model is solved using the advanced ILP solver Xpress-MP, using the parameters listed in the chart below. All simulation are carried out on a Linux workstation with an Intel Xeon 2.53 GHz CPU and 64 GB memory.

Figure 6:
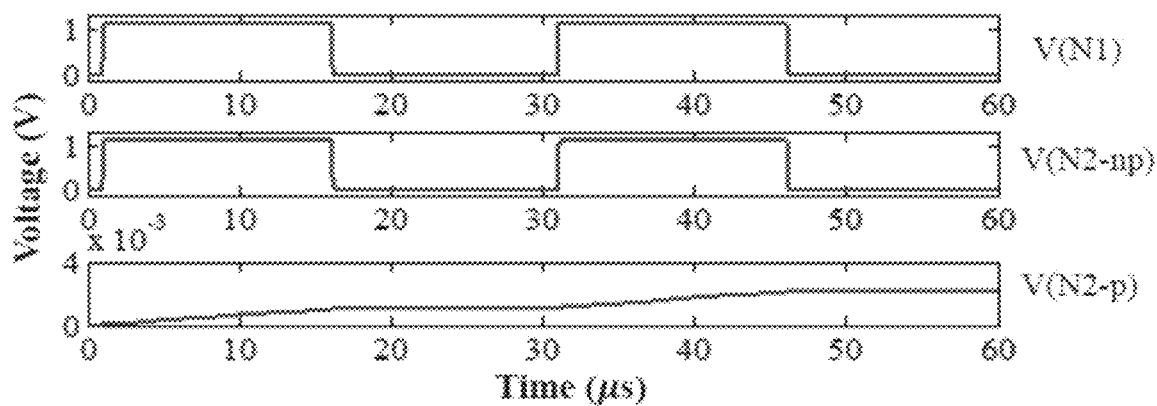
FIG. 6 is a graph showing simulation results for paired ILVs with an electronic fuse.

1. N: the total number of independent ILVs;
2. E: the total number of I/O pads on the top layer that can be reused;
3. K: the total number of subareas on the bottom area;
4. $P_k$: the number of ILVs on subarea k;
5. $Q_k$: the number of SFFs on subarea k;
6. $D_l$: the maximum number of ILVs that can be on one subarea;
7. $D_s$: the maximum number of SFFs that can be on one subarea;
8. $I_i$: binary value, whether independent ILV i is an input ILV;
9. $S_{kh}$: binary value, whether subareas k and h are adjacent to each other;
10. $L_{ih}$: binary value, whether independent ILV i is in subarea h;

In order to evaluate the feasibility of e-fuses, the circuit model in FIG. 3 is simulated using HSpice. The output of a gate at the bottom layer (N1) sends signal to point A through a 200 nm interconnect. Then the signal goes through the e-fuse, another 200 nm interconnect and finally reaches at the input of another gate at the bottom layer (N2). Before the e-fuse is programmed, the resistance of e-fuse is only 24.7Ω. Therefore, signals applied to N1 are transmitted through the e-fuse and are observed at N2, shown as V(N2-np) in FIG. 6. After the e-fuse is programmed, point A is separated from point B. As a result, no signals are transmitted to N2 and it is dangling, shown as V(N2-p) in FIG. 6. Therefore, the e-fuse is effective in connecting as well as separating two paired ILVs.

Figures 7A, 7B, 7C:
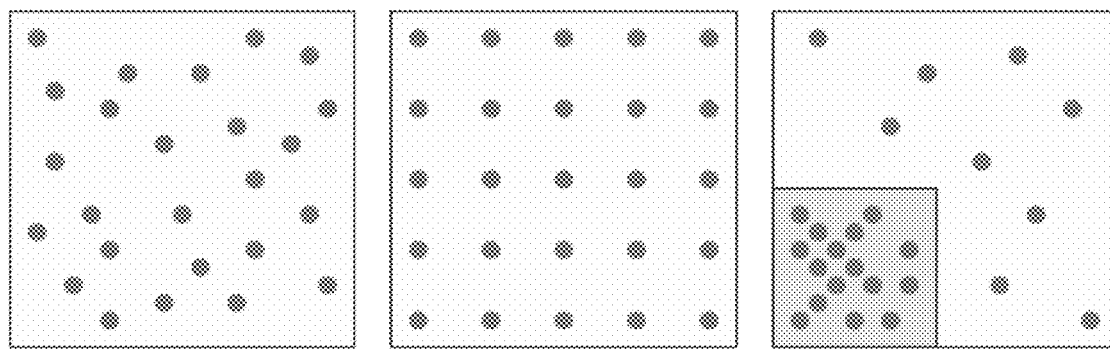
FIGS. 7A-7C are diagrams of example placement configurations for I/Os.

In order to evaluate the effectiveness of the ILV pairing algorithm, we considered several example M3D ICs using the ITC'02 SoC test benchmarks; these benchmarks are considered as the bottom layers of M3D ICs. Table I below lists the number of I/O ports for each benchmark. Since each design is considered to be a layer in an M3D IC, each I/O port of a benchmark corresponds to an ILV. Moreover, since the data distributed with these benchmarks do not contain the position information for I/Os (i.e., ILVs in this case), three types of placement configurations are considered for these benchmarks, as shown in FIGS. 7A-7C. In Configuration 1 shown in FIG. 7A, all ILVs are randomly placed on each benchmark and this is referred to as random placement In Configuration 2 shown in FIG. 7B, all ILVs are uniformly placed, where the distances from one input or output ILV to its adjacent output or input ILVs are the same. Configuration 2 is referred to as uniform placement. In Configuration 3 shown in FIG. 7C, 80% of the ILVs are placed on 20% of total benchmark area (dense region), while the 20% of the ILVs are placed in the remaining 80% of the total benchmark area (sparse region). Configuration 3 is referred to as density placement.

TABLE I

NUMBER OF I/OS FOR ITC'02 BENCHMARKS.

| Benchmark name | Number of inputs | Number of outputs |
|---|---|---|
| u226 | 177 | 199 |
| h953 | 438 | 491 |
| f2126 | 553 | 848 |
| p34392 | 919 | 1024 |
| d281 | 1523 | 1408 |

Figure 8:
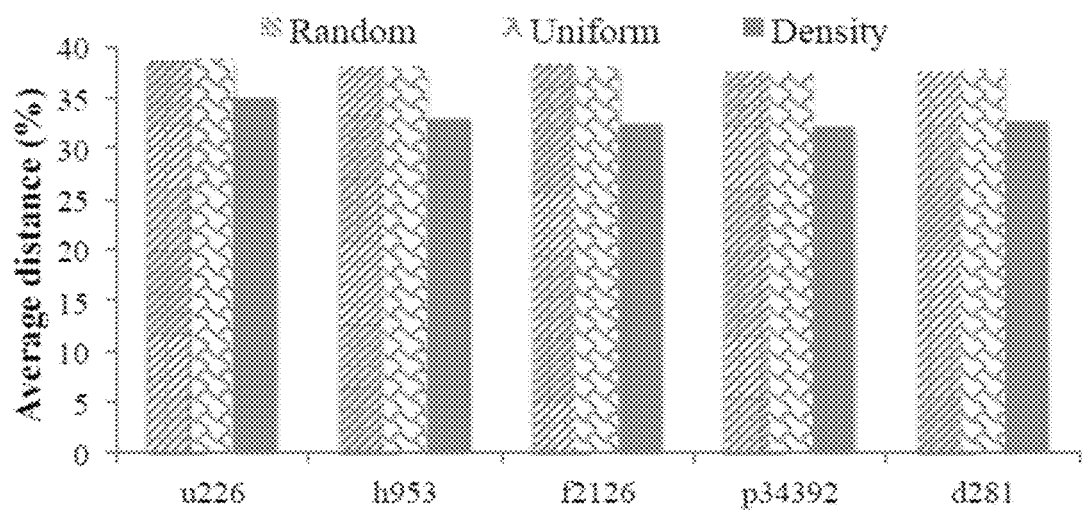
FIG. 8 is a graph showing normalized average distance for five example benchmarks.

Based on the three placements defined above, the distance matrices are generated for each benchmark: each placement corresponding to a unique distance matrix. As a result, each benchmark has three distance matrices. For each benchmark, both the maximum and minimum distances are similar for all three kinds of placements. Then the average distance for each placement is calculated and the normalized average distances with respect to the maximum distance in the matrix are shown in FIG. 8. For random and uniform placements, the normalized average distances are similar, ranging from 37% to 39%. For density placement, since the majority of ILVs are placed within a small area, its normalized average distance is smaller, ranging from 32% to 34%.

Figure 9:
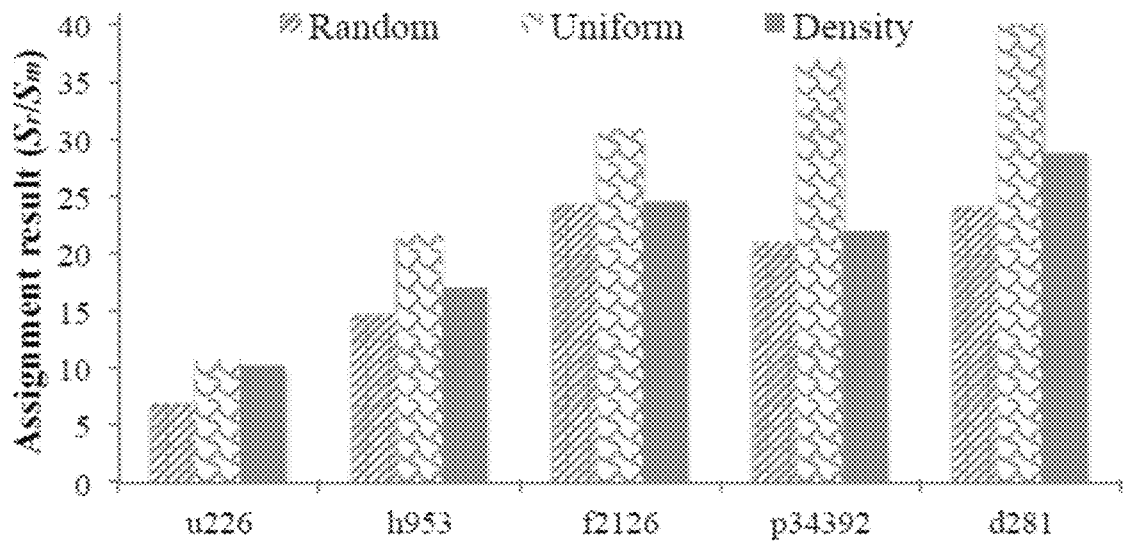
FIG. 9 shows the pairing results in terms of the ratio $S_r/S_m$.

Once the distance matrices are generated, they are provided as input to the Munkres-based optimization algorithm and the pairing results are generated. A baseline method is to evaluate the proposed method; for the baseline, ILVs are paired randomly. The sum of the distance between every two paired ILVs produced by the proposed method (baseline method) is denoted by $S_m$ ($S_r$). FIG. 9 shows the pairing results in terms of the ratio $S_r/S_m$. It can be seen that $S_r$ is 7 to 40 times larger than $S_m$, thus these results highlight the effectiveness of the proposed method. In addition, $S_r/S_m$ increases with an increase in the number of ILVs. This is because the baseline method randomly pairs two ILVs from a larger pool and thus results in larger values of $S_r$. Therefore, it is more desirable to use the disclosed approach when the number of ILVs is large.

Figure 10:
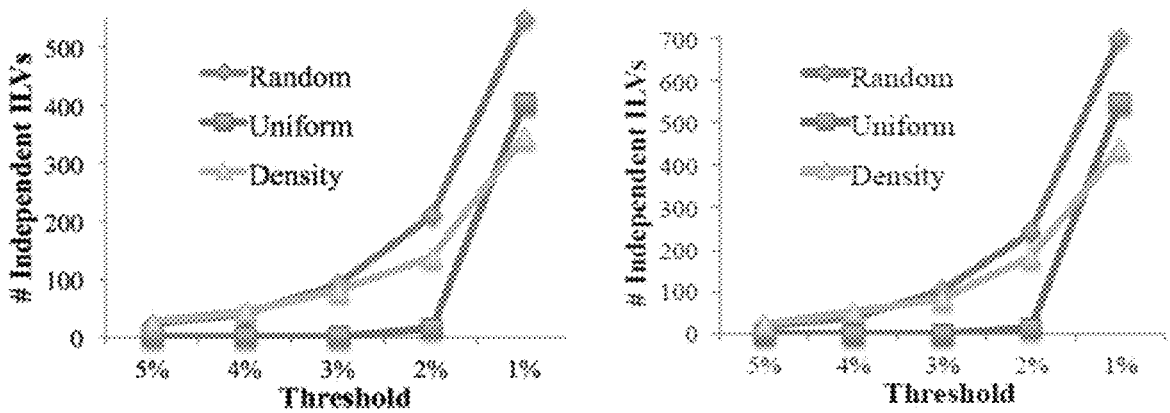
FIG. 10 are graphs showing numbers of independent ILVs.

Next, two benchmarks that contain the largest number of ILVs are analyzed: p34392 and d281. The ILV pairing is computed for different values of threshold thd, ranging from 1% to 5%. FIG. 10 are graphs (right is p34392, and left is d281) showing the number of independent ILVs when thd is varied. As expected, it is more difficult to compute paired ILVs for small values of thd; the number of independent ILVs increases as thd is reduced. However, the rates of increase for the three placements are different. When thd is varied from 1% to 5%, irrespective of what the threshold is, uniform placement always leads to fewer independent ILVs than random placement. For density placement, the number of independent ILVs is larger than the other two placements when thd is high. This is because the ILVs that are in the sparse region are more likely to be selected as independent ILVs. However, with a decrease in thd, the rate of increase for density placement is less than that for the other two placements, eventually resulting in the smallest number of independent ILVs when thd reaches 1%. This is because most of the ILVs are in the dense region and it is easier to compute more paired ILVs for this region. In summary, uniform placement can always produce good ILV pairing results while density placement outperforms uniform placement when thd is low. Note that cost optimization cannot be applied to these benchmarks because the benchmark distribution does not include any of the design parameters listed herein.

Figure 11:
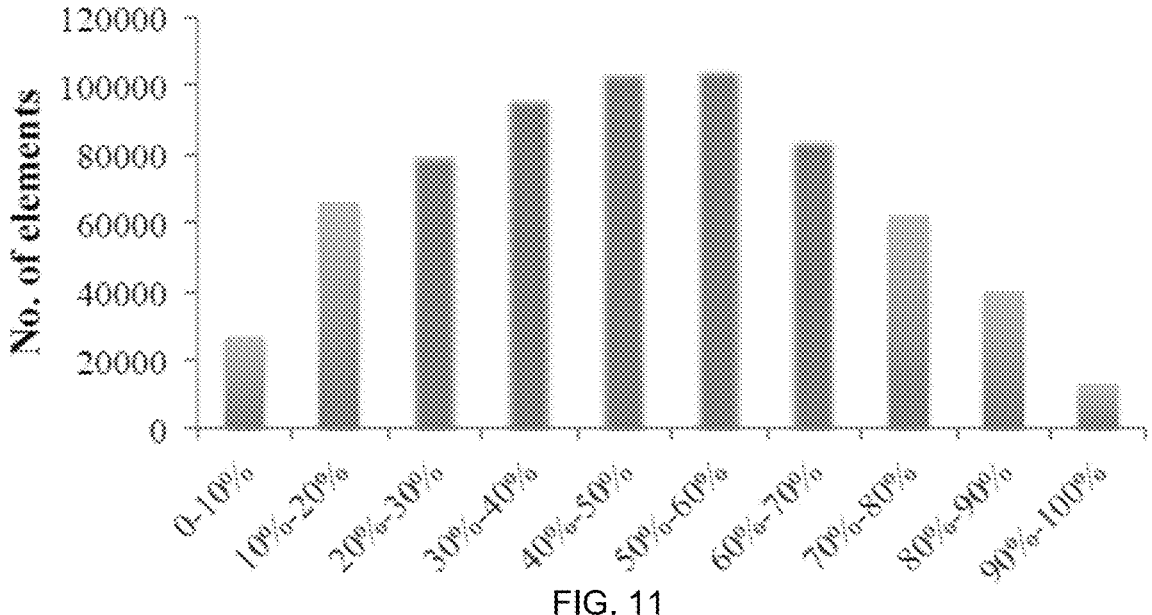
FIG. 11 is a graph showing distribution of elements in a distance matrix for B-M3D.

Next, an actual industry design as the bottom layer of a hypothetical M3D IC is analyzed. This is referred to as B-M3D ("Bottom-M3D"). It is implemented on an advanced technology node and it contains 855 inputs and 793 outputs, which are treated as input ILVs and output ILVs, respectively. The distances between input ILVs and output ILVs are calculated and a distance matrix is generated. The distribution of elements in the matrix is illustrated in FIG. 11: each element is divided by the largest element in the matrix and the normalized percentage is shown in the figure. It can be seen that the majority of (mormalized) elements in the matrix are in the 40% to 60% range. Therefore, 40% is taken as thd for B-M3D.

Figure 12:
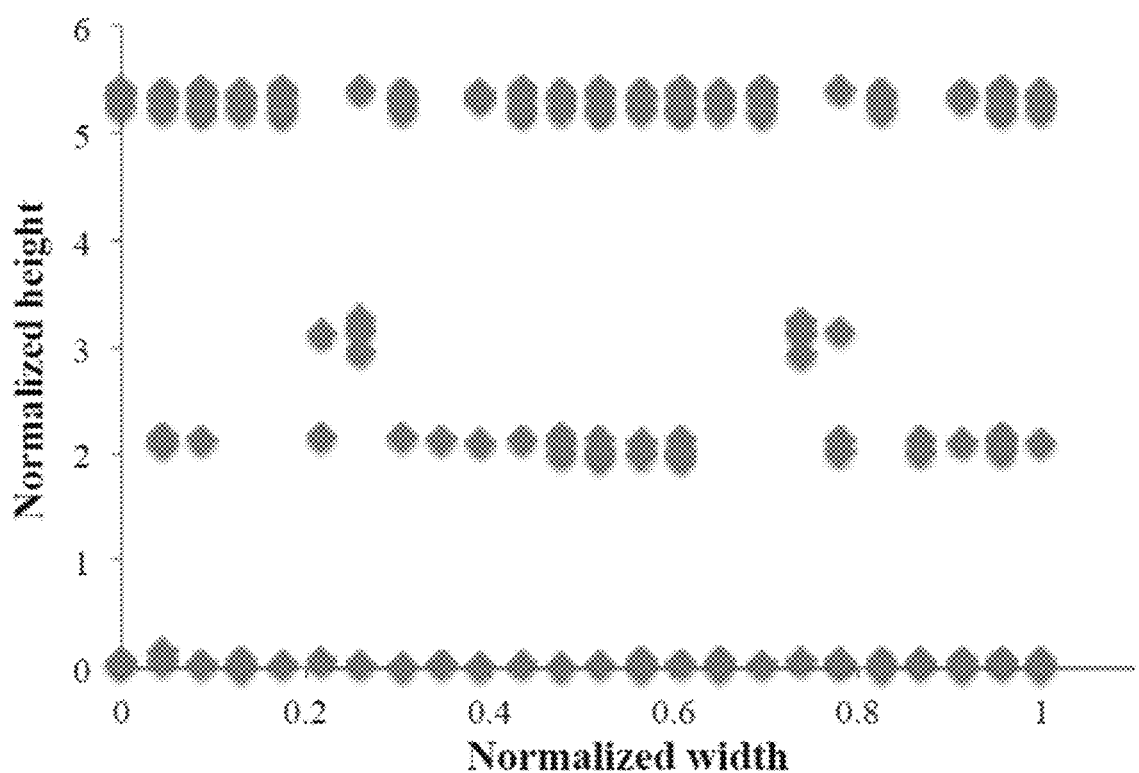
FIG. 12 depicts positions of all the independent ILVs in a B-M3D.

Next the ILV-pairing algorithm is applied to B-M3D and paired ILVs are identified. A total of 62 independent ILVs are identified due to an imbalance between the number of input and output ILVs. In addition, 70 more independent ILVs are generated because their distances to any unpaired ILVs exceed thd. The positions of all independent ILVs are shown in FIG. 12. The position of each independent ILV is normalized with respect to the width of B-M3D. Since the length of B-M3D is around 6 times its width, some independent ILVs are located at positions where y≈5. In FIG. 12, all independent ILVs can be divided into three groups. For the ILVs whose positions at y≈5 (group 1), they are input ILVs generated due to a imbalance between the number of input and output ILVs. The other two groups are generated due to the constraint of thd. For the ILVs whose positions at $2 \leq y \leq 4$ (group 2), they are input ILVs; for the ILVs whose positions at y≈0 (group 3), they are output ILVs. In summary, group 1 is farthest from group 3; the distance between group 2 and group 3 is larger than thd.

Figure 13:
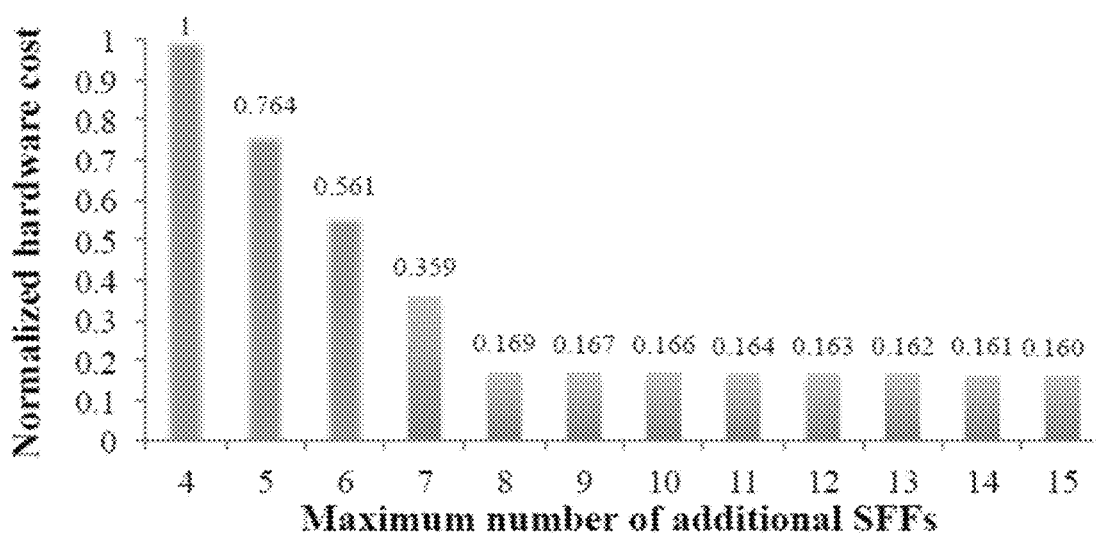
FIG. 13 is a graph showing a normalized hardware cost.

Once the ILVs are paired, in order to determine which type of DfT structure is used for each independent ILV, a total of 132 independent ILVs are considered for cost-optimization. The B-M3D design is divided into 16 subareas; the number of independent ILVs at each subarea ranges from 1 to 16. Since B-M3D is implemented at an advanced technology node, the ratio of hardware cost for four types of DfT structures, "Distance SFF", "Local SFF", "New Pad", and "Reused Pad", is 11:9:100:12. A maximum of 8 additional ILVs and 4 additional SFFs are allowed for each subarea, and the total number of reusable pads is 5. The optimization method assigns 50 independent ILVs for "Local SFF," 14 independent ILVs for "Distance SFF," 5 independent ILVs for "Reused Pad", and 63 independent ILVs for "New Pad". Next the maximum number of additional ILVs allowed for each subarea is increased from 8 to 11. Although the number of "Reused_Pad" and "New_Pad" DfT structures remain the same, the number of "Local_SFF" is increased from 50 to 56. This is because the increase in the maximum number of additional ILVs allowed provides flexibility for the locations of "Reused_Pad" and "New_Pad". As a result, more additional SFFs can be placed within the same subarea as their corresponding independent ILVs. Finally, the maximum number of additional SFF allowed for each subarea is varied from 4 to 15, and the normalized hardware cost is shown in FIG. 13 with respect to the maximum cost. When the maximum number of additional SFF is varied from 4 to 8, the hardware cost drops sharply. This is because all "New_Pad" structures are eliminated in this region. When the maximum number of additional SFF is further varied from 9 to 15, the hardware cost drops slowly because the number of "Distance_SFF" structures is reduced in this region.

Continued scaling of integrated circuits has resulted in increased interconnect delay being a major performance bottleneck. A combination of chip-scale wires and TSVs may be utilized for overcoming this problem. This solution can be incorporated in 2.5D ICs, which are recognized as a precursor to 3D integration, but with lower fabrication cost and less design complexity.

Figure 14:
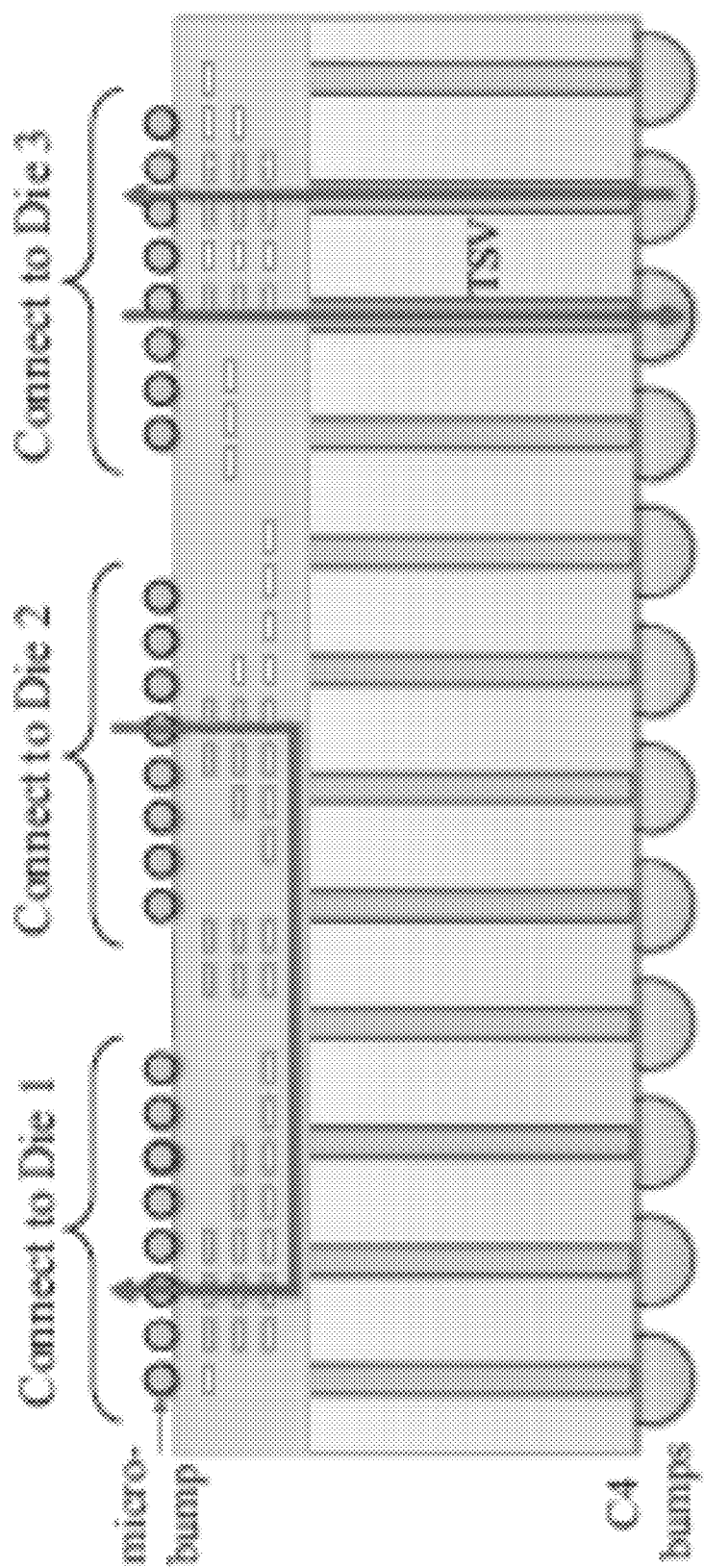
FIG. 14 is a diagram showing an interposer example with functional paths.

The fabrication of 2.5D ICs involves the introduction of a passive silicon interposer that is placed between the package substrate and the dies. A cross-sectional view of an interposer example with functional paths is shown in FIG. 14, which illustrates an interposer example with functional paths. The interposer contains both horizontal and vertical interconnects. These interconnects are fabricated using the same processes as the interconnects in the silicon dies. As a result, with the high-density interconnects, 2.5D ICs can provide enhanced system performance, reduced power consumption, and support for heterogeneous integration.

In a 2.5D IC, testing of the interposer before die stacking is essential to minimize the yield loss that results from the stacking of good dies on a defective interposer. This need is especially critical since the interposer is the least expensive component in the entire stack. In the worst case, a cheap, but faulty, interposer will render the expensive 2.5D IC unusable. Therefore, pre-bond testing of the silicon interposer is needed to avoid the stacking of known good dies on a faulty interposer.

The interposer cannot be tested easily before it is stacked with other dies due to several reasons. Pre-bond testing of interposer targets both horizontal and vertical interconnects, which requires double-sided probing. However, double-sided probing may not be feasible and improvements may be needed in the assembly process and test flow. In addition, it is difficult to probe the micro-bumps on the top side of the interposer due to their high density. Moreover, interconnects are separated from each other at the pre-bond stage, and no test loops can be formed at this stage. Therefore, new and innovative solutions are needed for pre-bond testing.

Herein, an efficient solution is provided for locating defects in the passive interposer at the pre-bond stage. The proposed test architecture uses e-fuses that can be programmed to connect or disconnect separated interconnects inside the interposer. Therefore, the functionality of the interposer is not affected once the dies are stacked on it. Also disclosed herein are assemblies and test flows that facilitate pre-bond interposer test. These assemblies and test flows have been validated in a production environment. In order to reduce test time, the concept of a weighted critical area is introduced. The proposed solution therefore obviates the need for a more expensive active interposer. HSPICE simulation results are presented to demonstrate the effectiveness of the pre-bond test solution. The advantage of using the weighted critical area is also analyzed and presented herein.

Figure 15:
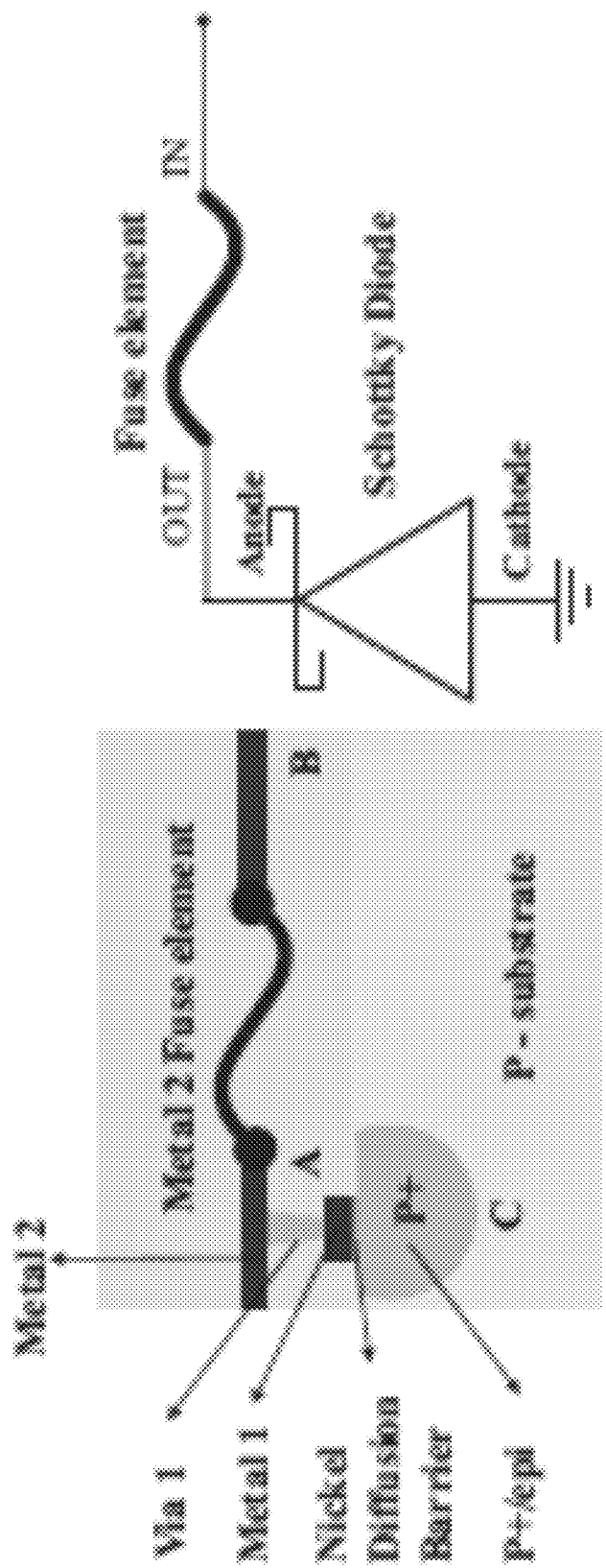
FIG. 15 illustrates a diagram of a structure of an example e-fuse based on a Schottky contact.

E-fuses have been used in a variety of applications due to their programmability. FIG. 15 illustrates a schematic diagram of an example e-fuse. Referring to FIG. 15, OUT is connected to the anode of the Schottky contact. When testing the interconnects/TSVs, the e-fuse is not programmed and signals flow through it. After testing, a high current pulse is applied at IN to the e-fuse such that it is programmed open at OUT and the current is discharged through the cathode of the Schottky contact into the silicon substrate. With the use of Schottky contact, the interposer is still passive after the inclusion of e-fuses. It can be important to enable the pre-bond testing of passive interposers since active interposers increase production cost. Example methods disclosed herein are therefore targeted at passive interposers.

There are three kinds of e-fuse devices: (i) formed with a silicide gate poly-Si electrode material (gate-electrode-fuse); (ii) constructed from Cu wire (Cu-fuse); and (iii) consisting of a Cu-via (via-fuse). The resistance of the Cu-fuse can be as small as 25Ω before programming and several GΩs after programming. The low on-off resistance ratio of the Cu-fuse can be make it particularly suitable for test methods disclosed herein. As a result, a Cu-fuse may be utilized.

In accordance with embodiments, die footprints and test architectures are disclosed. An example test flow is described and test procedures are described. Finally, the weighted critical area is introduced to save test time. Although the dies have not been mounted on the interposer at the pre-bond stage, the design and fabrication of the interposer interconnects may be based on the information (i.e., layout) of dies that can subsequently be placed on the interposer. Therefore, each die has a corresponding footprint on the interposer for subsequent bonding. The die footprint refers to the micro-pillar area to which the top-die connects to on an interposer. In this example, it contains all interconnects to and from the specific die. The directionality of interconnects is not taken into consideration in this example because they are typically just back-end of line (BEOL)/metal lines and can be treated as direction independent before the top-die is assembled. As a result, although dies are not considered in the pre-bond stage, the corresponding die footprint can be taken into consideration.

Before the dies are stacked on the interposer, each interconnect in the interposer connects two separate die footprints. In an example, separated interconnects are connected via e-fuses. Based on FIG. 14, it is clear that interposer testing requires the following: (1) testing of horizontal interconnects; (2) testing of vertical interconnects. Since it is difficult to probe both sides of the interposer simultaneously, these two types of interconnects are tested separately in this example method.

The length of each e-fuse may be restricted in order to save space. In particular, for horizontal die-to-die interconnects, consider a test through four die footprints as 2→1→4→3. Since the interconnect 2→1 ends at Die 1 footprint and interconnect 1→4 starts at Die 1 footprint, connecting them using an e-fuse within the Die 1 footprint involves less interconnect length than doing it outside the die footprint. Therefore, each e-fuse can only be located within a single die footprint for testing horizontal interconnects; thus, for two horizontal interconnects to be connected by an e-fuse, they can share at least one die footprint. For vertical interconnects, the TSVs are spread out through the interposer. Connecting them through e-fuses outside the die footprint can be a less costly option.

Figure 16:
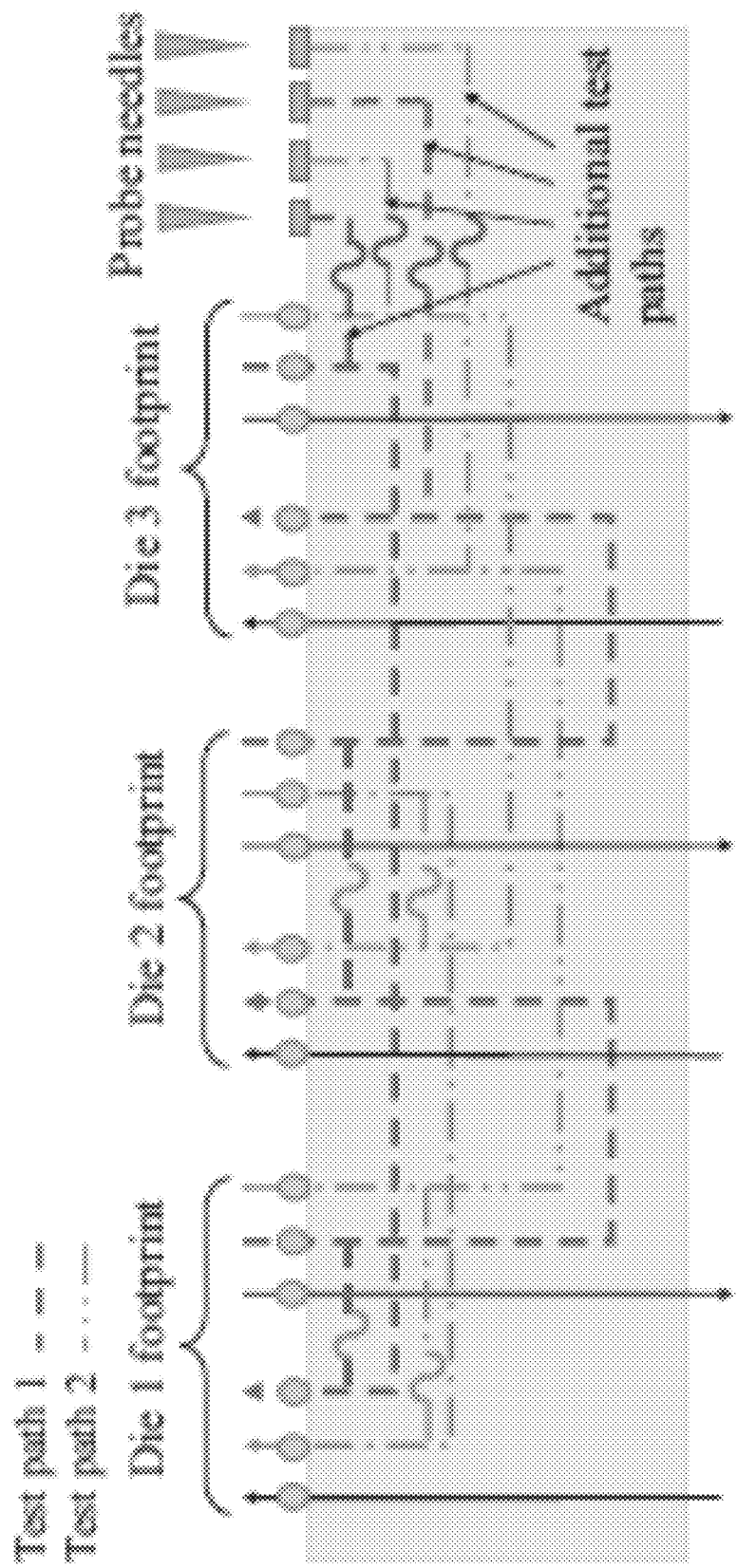
FIG. 16 is a diagram showing example test paths for targeting horizontal interconnects in accordance with embodiments of the present disclosure.

FIG. 16 illustrates a diagram showing example test paths for targeting horizontal interconnects in accordance with embodiments of the present disclosure. Here an interposer example is utilized to illustrate an example test architecture in accordance with embodiments. E-fuses are inserted inside the interposer, and horizontal interconnects, which are not connected in functional mode, are now connected for testing. In FIG. 16, two test paths are formed that start from the I/O ports in Die 3 footprint, pass through all three die footprints, and end in Die 3 footprint. It can be seen that the e-fuses are only located within a single die footprint; there are no e-fuses that span two die footprints. Test Path 1 starts from Die 3 footprint, passes through Die 1 footprint and then Die 2 footprint, and ends in Die 3 footprint. Similarly, Test Path 2 starts from Die 3 footprint, passes through Die 2 footprint and then Die 1 footprint, and ends in Die 3 footprint. Once the test paths are formed, test patterns are applied to the test paths and the horizontal interconnects can be tested. After all horizontal interconnects are tested, the e-fuses can be programmed and their resistance can increase to a significantly large value. As a result, the e-fuses can be viewed as opens in the interposer. When the dies are later mounted on the interposer, these programmed e-fuses may not affect chip functionality. Because the micro-bumps on the top of the interposer have very high density, it is difficult to use them to probe the interposer. Therefore, additional test paths may be inserted into the interposer for probing purposes. As shown in FIG. 16, each additional test path is composed of a probe pad and an e-fuse. These probe pads and e-fuses are referred to as additional pads and additional e-fuses, respectively. In order to probe the interposer using standard probe needles, additional pads are fabricated with a larger pitch. Because they have different control signals, the additional e-fuses are different from the e-fuses that connect the functional interconnects. Thus, these two types of e-fuses are represented in different ways in FIG. 16. The additional e-fuses are also programmed after horizontal interconnect testing is complete so that the functionality of the 2.5D IC is not affected once the dies are stacked.

The test architecture for vertical interconnects is similar. E-fuses are inserted inside the interposer, and separated vertical interconnects are then connected. Once the test paths are formed between vertical interconnects, test patterns can be applied to these test paths from the bottom of the interposer. Since C4 bumps at the bottom of the interposer can be probed directly with standard probe needles, no additional test paths are required to test vertical interconnects. Once all vertical interconnects have been tested, e-fuses can be programmed and treated as opens, once again disconnecting separate functional interconnects inside the interposer.

Figure 17:
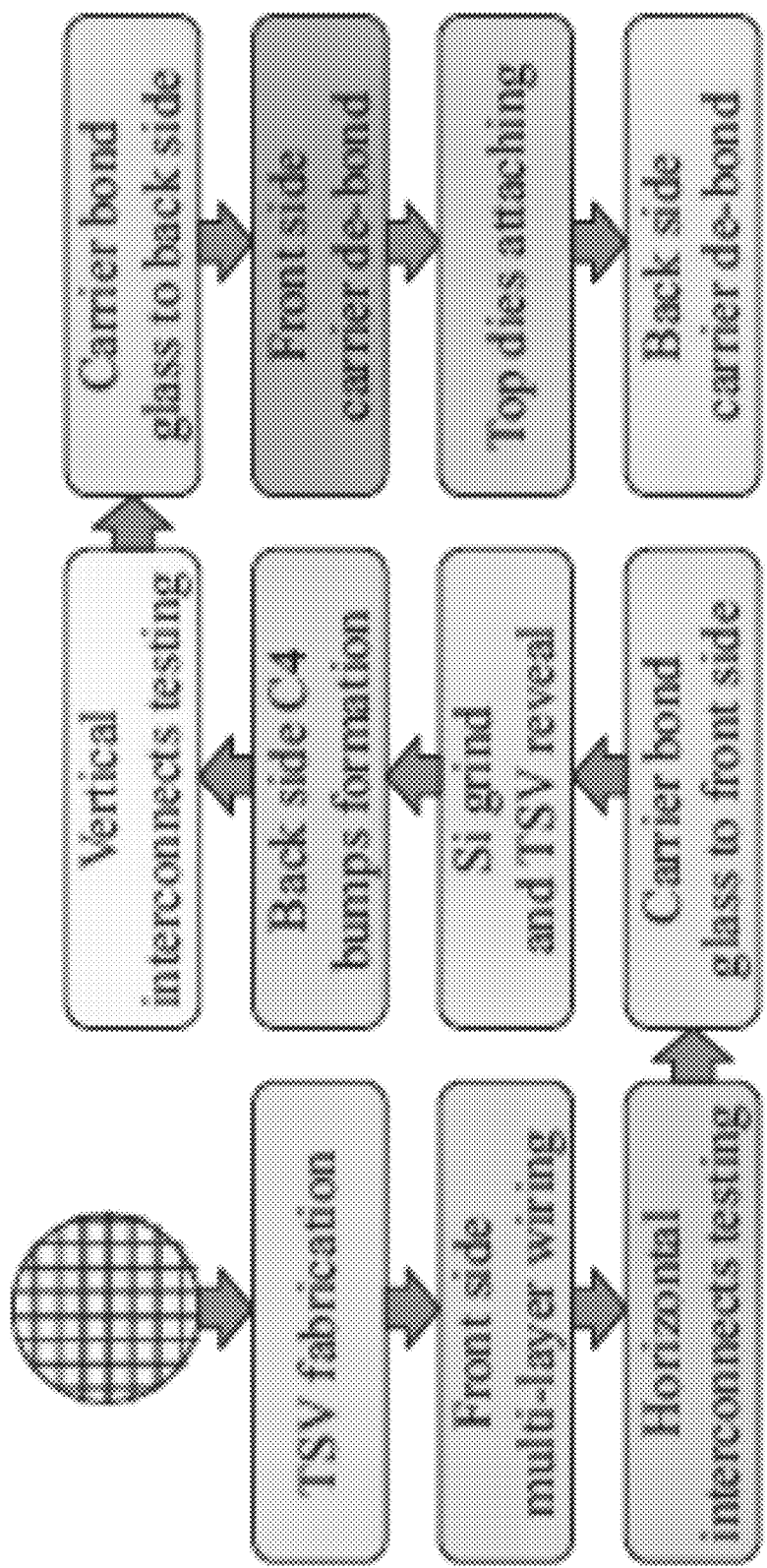
FIG. 17 is a flowchart of an example assembly and test flow for pre-bond testing in accordance with embodiments of the present disclosure.

In contrast to 2D ICs, which require only one wafer-level test insertion, information about both final thick-wafer test and thinned wafer test steps can be used in order to determine a known good interposer (KGI) for 2.5D ICs. FIG. 17 illustrates a flowchart of an example assembly and test flow for pre-bond testing in accordance with embodiments of the present disclosure. Thick-wafer test can be used to test horizontal interconnects. The BEOL layers such as Cu and Al are first plated on the thick wafer; then the horizontal interconnects are tested prior to wafer fab-out. If standard probe cards are used, then additional probe pads may be required. However, a fine-pitch probe card with compliant probes can be used to test directly on the micro-bump pads having a NiAu finish. This eliminates the need for additional probe pads and access to program the e-fuses that is used to form longer test paths. Afterwards, wafers are bonded to temporary glass carriers from the front.

The testing of thinned wafers can be a significant challenge but it can be addressed using techniques that are currently deployed in industry. Compared to some other methods mentioned, e-fuses are less costly and thereby can be used more easily to form test paths. Thin-wafer test is implemented after TSV-reveal to test vertical interconnects. The C4 bumps can be completed prior to thin-wafer test to prevent probing on backside Cu pads. Subsequently vertical interconnects can be tested via e-fuses; afterwards, thinned wafers can be bonded to another temporary glass carrier from the back. Finally, two glass carriers can be de-bonded separately; top dies can be attached to the front side of the interposer and the stack is assembled on to a package substrate. In order to support this two-sided test for interposers, an example assembly process can be implemented with a wafer support system so that the interposers are on a carrier wafer and can be probed on either side.

Three types of faults can typically occur in the horizontal interconnects: open faults, inter-bridge faults, and inner-bridge faults. Open faults refer to any hard or resistive opens, regardless of the fault location. Inter-bridge faults refer to bridge faults that occur between two test paths; e.g., an interconnect in one test path is shorted with another interconnect in a different test path. Inner-bridge faults refer to bridge faults that occur inside a single test path; e.g., an interconnect in a test path is shorted with another interconnect from the same test path. In order to identify the type and location of these faults, specific test procedures are required. Since each test path can be viewed as a single interconnect, a suitable interconnect test algorithm (True/Complement algorithm) may be used. Similarly, the detection of open faults and inter-bridge faults does not depend on whether a test path or a functional interconnect is viewed as a single interconnect. Therefore, open faults and inter-bridge faults can also be detected by the True/Complement algorithm. With this algorithm, test patterns are applied to one end of a test path and test responses are observed at the other end. However, this method is not applicable for the detection of inner-bridge faults. For example, suppose a logic 1 is applied to a test path at one end. No matter whether the test-path is fault free or contains inner-bridge faults, a logic 1 may be observed at the other end. Therefore, the faulty response is identical to the correct response. As a result, a new test procedure has been developed for inner-bridge faults.

Figure 18:
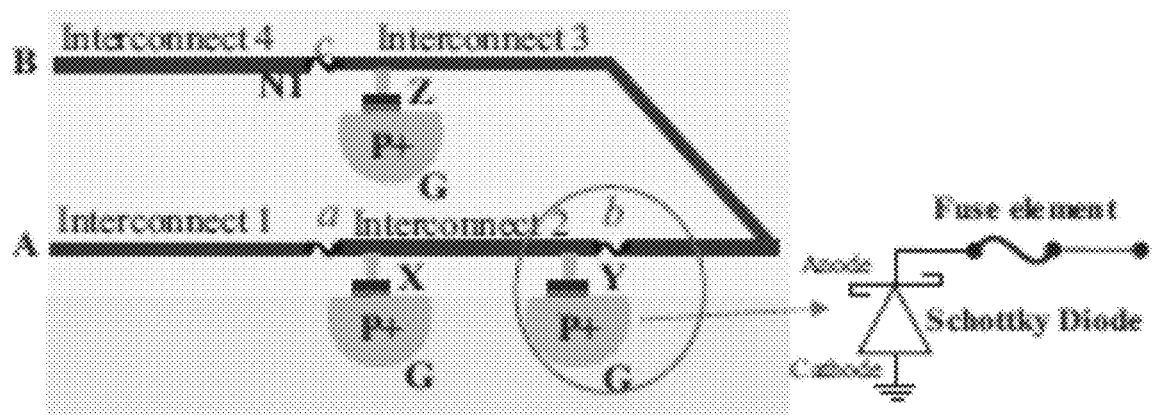
FIG. 18 is a diagram showing an example test path.

A test path is shown in FIG. 18. This test path is composed of four functional interconnects, and these interconnects are connected by e-fuses a, b, and c. To detect the inner-bridge faults, the e-fuse that is closest to point A is different from the other e-fuses; specifically, its diode is at the end rather than at the head. An example test procedure includes applying logic 1 at point A and observing the response at point B. If there are no faults in the test path, a logic 1 can be observed at point B.

The example test procedure can also include programming the e-fuse a so that the test path is open at a's position.

Further, the example test procedure includes applying logic 1 at point A and discharging interconnect 2 through point X. If a logic 1 is observed at point B, it indicates that an inner-bridge fault exists between interconnect 1 and the remaining interconnects. Otherwise, point B is grounded via point X and interconnect 1 does not have an inner-bridge fault.

The example test procedure also includes applying logic 1 to point B and programming the e-fuse b so that the test path is open at b's position. Interconnect 2 is discharged through point Y. Then point B can be taken as an observation point and the voltage level is measured at point B. If logic 0 is observed at point B, it indicates that an innerbridge fault exists between interconnect 2 and the remaining interconnects. Otherwise, the charge in the remaining interconnects should remain high and a weak logic 1 should be observed at point B with a slow discharging rate.

Figures 19A, 19B, 19C:
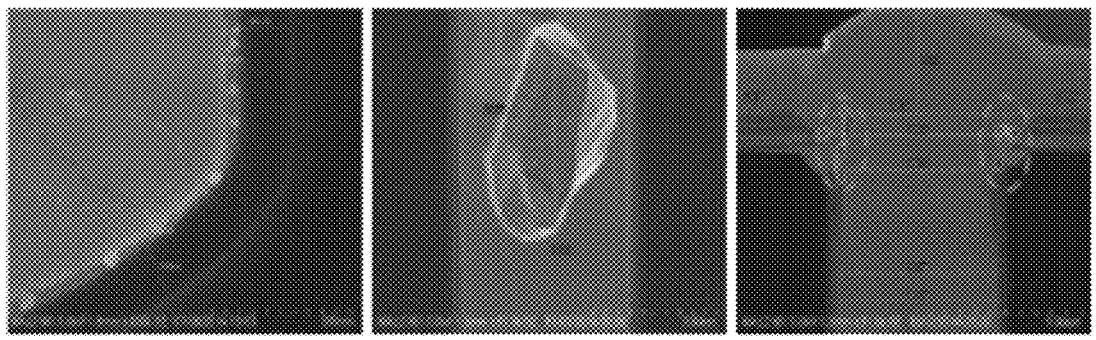
FIGS. 19A-19C are images of the three faults (break faults, void faults, and pin-hole faults, respectively)

The example test procedure also includes applying logic 1 to point B and program e-fuse c so that the test path is open at c's position. Interconnect 3 is discharged through point Z. Then the voltage level is measured at point B. The same method used in step 3 is utilized to detect whether there is an inner-bridge fault between interconnect 3 and interconnect 4. Based on known data, the pitch of the vertical interconnects is large (100 μm). Therefore, bridge faults are unlikely to occur in vertical interconnects and thus the True/Complement algorithm is not necessary for vertical interconnect testing. During the TSV processing, there are three types of faults that can occur in vertical interconnects: break faults, void faults, and pin-hole faults. FIGS. 19A-19C are images of the three faults (break faults, void faults, and pin-hole faults, respectively). Break faults and void faults increase the TSV resistance by different amounts based on the defect dimensions. Pin-holes create a conduction path from the TSV to the substrate, resulting in a leakage fault. In order to detect these faults, a high voltage is applied to the vertical test paths. The three types of faults can be detected and identified based on the differences in response voltage. Because the interconnects are not uniformly distributed on the interposer, some areas of the interposer may have a higher density of interconnects. An area with more interconnects, which can be flagged based on technology, process, and yield considerations, is referred to as weighted critical area. If a test path contains functional interconnects that connect to the same weighted critical area, it is referred to as a dense test path; otherwise, it is called a non-dense test path. In non-dense test paths, no two interconnects are in the same area and hence inner-bridge faults are less likely to occur; thus, it is not necessary to program e-fuses in that test path serially and programming time is reduced.

Figure 20:
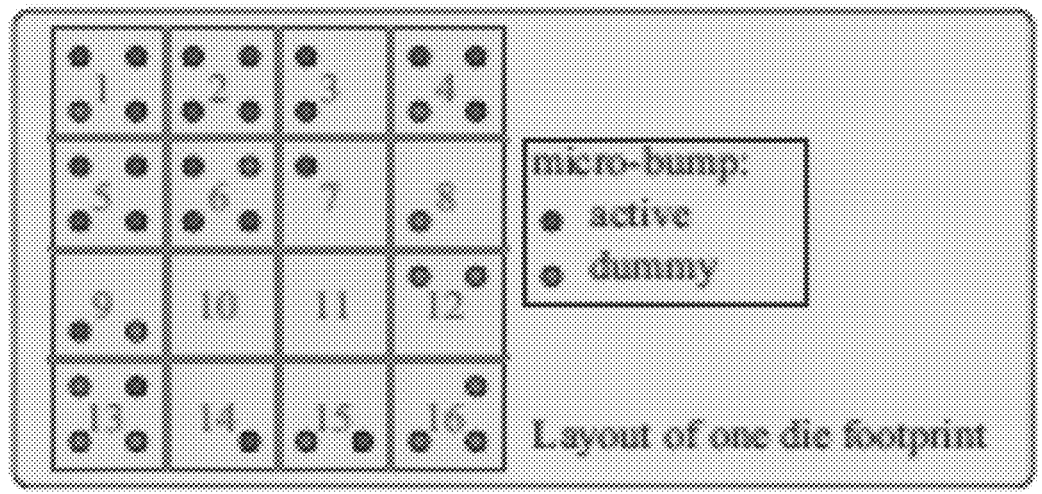
FIG. 20 is a diagram depicting the subarea division for an example die footprint.

In a typical interposer, the location of micro-bumps can be easily tracked from the design netlist. Some micro-bumps (dummy micro-bumps) are not connected to any interconnect. Therefore, a weighted critical area is only determined by the information of active micro-bumps. A systematic method is provided to determine a weighted critical area. For example, let the length and the width of an interposer be $L_{int}$ and $W_{int}$. The interposer is divided into n×n subareas, where n is defined as the division resolution of the interposer. The number of active micro-bumps is accounted for each sub-areas (num); the average value (avg) and standard deviation (σ) are calculated. If $num_i$ is greater or equal to avg+σ, then the subarea i is defined as a weighted critical area. As shown in FIG. 20, the interposer is divided into 16 subareas; avg and σ are calculated as 1.5 and 1.414. FIG. 20 is a diagram depicting the subarea division for an example die footprint. Therefore, subareas 1, 2, 4, 5, 6 are determined to constitute the weighted critical area.

In order to analyze the influence of weighted critical area, we use the acronym "WCA" to refer to the testing approach that considers the weighted critical area; "nWCA" refers to the testing approach that does not consider weighted critical area. In nWCA, since bridge faults may exist between any two interconnects, all test-paths must be tested for inner-bridge faults. In contrast, only dense test paths are tested for innerbridge faults in WCA. Therefore, the use of WCA can help us to reduce the testing time.

Figure 21A:
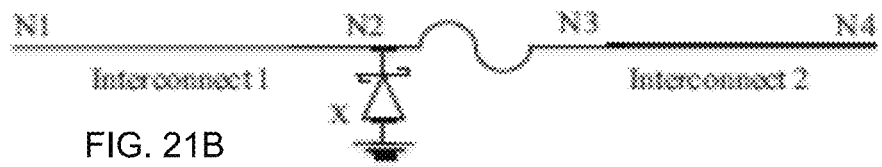
FIG. 21A is a circuit model for simulation to analyze the effectiveness of e-fuses.

Disclosed in the following are simulation results and an evaluation of the benefits provided by the weighted critical area. The simulations were carried out using HSPICE. The parameters (Table I) reflect the state-of-the-art interposer technology. The circuit model of FIG. 21A is simulated in order to analyze the effectiveness of the e-fuses. The technology parameters used for simulation are shown in Table II below.

TABLE II

TECHNOLOGY PARAMETERS USED FOR SIMULATION

|  | Diameter<br>10 μm<br>Width | Height<br>100 μm<br>Thickness | Pitch<br>100 μm<br>Resistance | $t_{ox}$<br>230 nm<br>Capacitance |
|---|---|---|---|---|
| TSV |  |  |  |  |
| M1 | 45 nm | 105 nm | 9.435 Ω/μm | 0.2173 IF/μm |
| M2 | 45 nm | 100 nm | 9.467 Ω/μm | 0.2035 IF/μm |

Figure 21B:
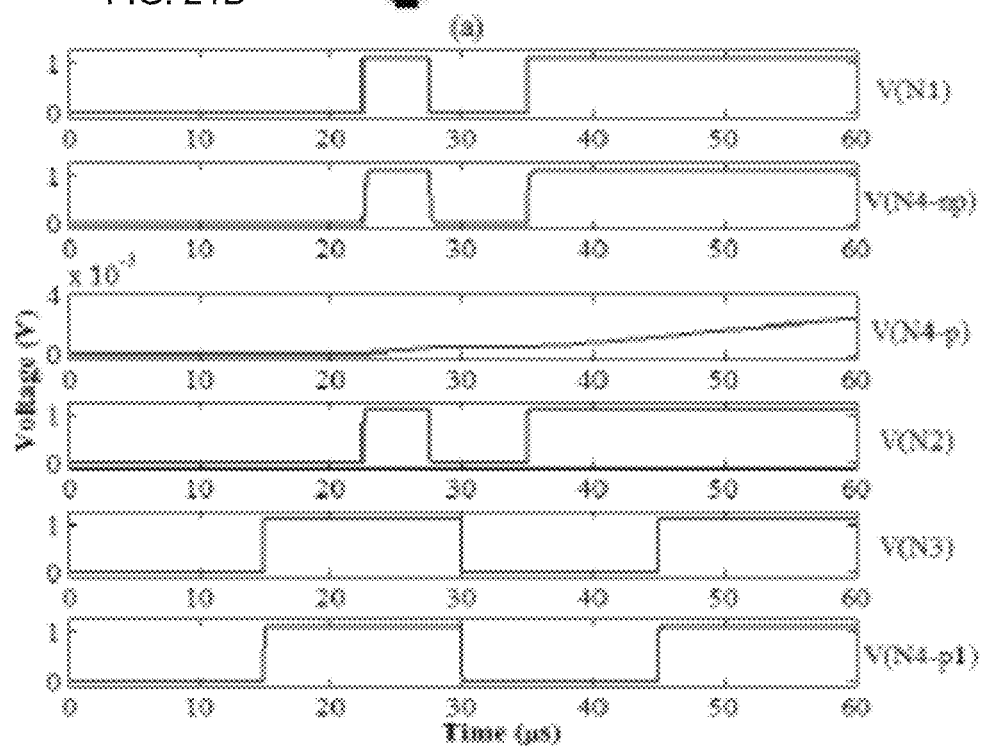
FIG. 21B is a graph showing test results.

Two 1700 μm-length horizontal interconnects are connected by an e-fuse and a sequence of signals is applied to N1, shown as V(N1) in FIG. 21B. Before the e-fuse is programmed, its resistance is as small as 25Ω. Therefore, the e-fuse can be viewed as a short circuit and Interconnect 1 and Interconnect 2 are connected together. As a result, the signals applied to N1 are transmitted through the interconnects and are observed at N4, shown as V(N4-np) in FIG. 21B. After the e-fuse is programmed, its resistance is as large as 4 GΩ. Therefore, the e-fuse can be viewed as an open circuit and Interconnect 1 is separated from Interconnect 2. As a result, no signals are transmitted to N4 and N4 is dangling, shown as V(N4-p) in FIG. 21B.

Another set of simulations is carried out to verify that the programmed e-fuse does not affect the functionality of the interposer. Specifically, signals from N1 are applied to Interconnect 1 and signals from N3 are applied to Interconnect 2. With the programmed e-fuse, the responses from N1 are observed at N2, shown as V(N2) in FIG. 21B, and the responses of N3 are observed at N4, shown as V(N4-p1) in FIG. 21B. It can be seen that the two interconnects can operate independently. Therefore, the programmed e-fuse does not affect the normal functionality of the interposer.

Figure 22:
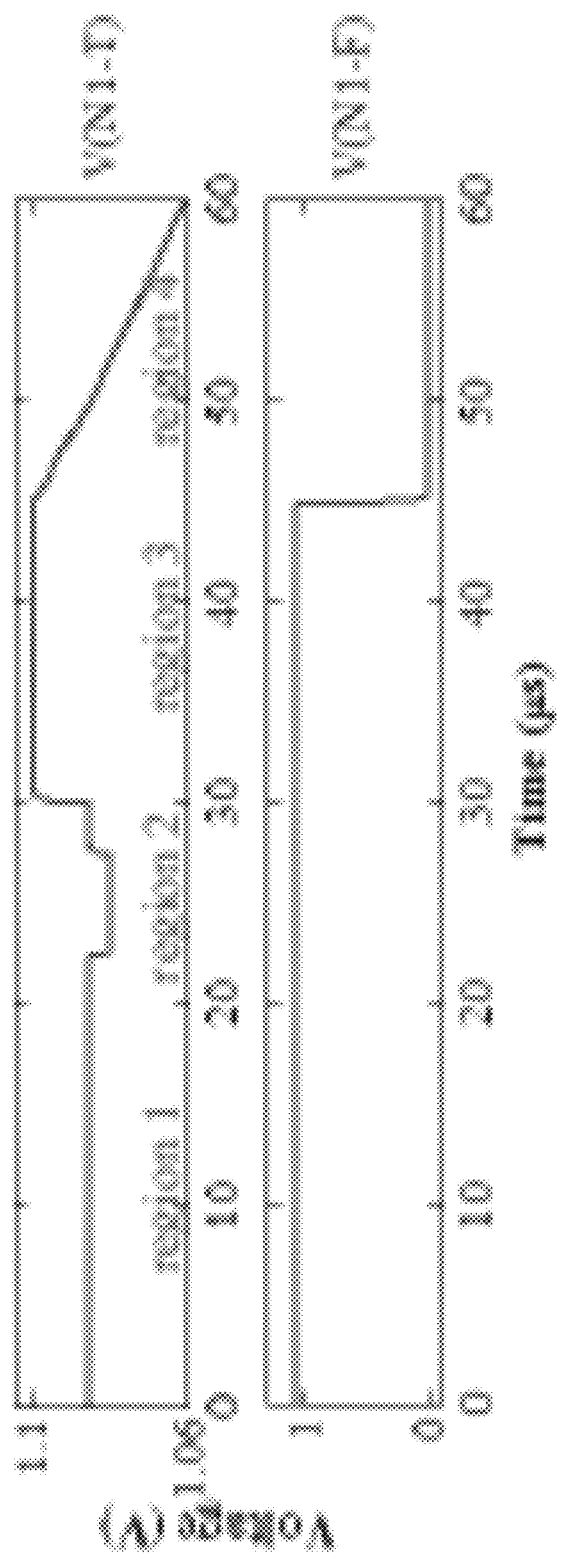
FIG. 22 is a graph showing simulated responses.

The test procedure for inner-bridge faults was also simulated. The schematic in FIG. 18 is simulated. In the simulated condition, e-fuse a has already been programmed Point X is grounded and point Z is isolated from the ground. FIG. 9 shows the responses at the observation point N1, which is one end of Interconnect 3. Meanwhile, a logic 1 is applied to B until 45 μs. If there is no inner-bridge fault between Interconnect 2 and the remaining interconnects, the responses at N1 are shown as V(N1-T) in FIG. 22. In region 1, the N1 voltage is slightly lower than 1.1 V because the circuit is shorted to ground through point X. Then, the e-fuse b is programmed in region 2. In this region, since a discharge path is temporarily formed through point Y, N1 voltage decreases slightly. After e-fuse b is completely programmed, the circuit is open at position b. Since there is no path between "Interconnect 3-e-fuse c-Interconnect 4" circuitry and ground, N1 voltage increases to 1.1 V in region 3. At 45 μs, no signal is applied to B and B is dangling. Then, N1 voltage decreases slowly in region 4 due to discharge through capacitors. If there is an inner-bridge fault between Interconnect 2 and the remaining interconnects, the responses at N1 are shown as V(N1-F) in FIG. 22. In this situation, regardless of whether e-fuse b is programmed, there is always a path between N1 and ground. Therefore, once B is dangling, N1 voltage drops to zero quickly. Based on the difference between V(N1-T) and V(N1-F), it can be seen that the proposed test procedure for inner-bridge faults is effective.

Figures 23A, 23B, 23C:
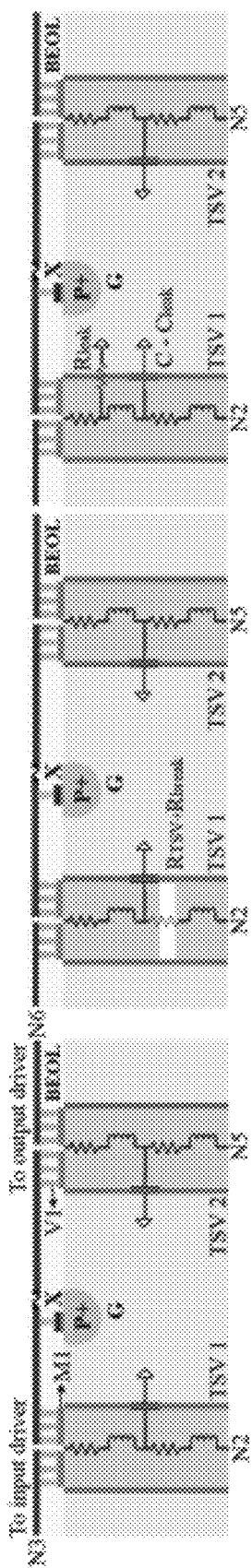
FIG. 23A is a circuit model having two vertical interconnects connected by an e-fuse.
FIG. 23B is a circuit model with a full-open defect.
FIG. 23C is a circuit model with a pin-hole fault.

The circuit model in FIG. 23A, which has two vertical interconnects connected by an e-fuse, is simulated. Each vertical interconnect is composed of a TSV, M1, and V1 vias. The length of M1 is 4.5 μm; the via V1 is typically 45 nm in diameter and 80 nm in height. Each M1 is connected to 6 V1s in parallel. In addition, each vertical interconnect is connected to an input or output driver through a horizontal interconnect. Since the effectiveness of e-fuse is verified as described herein, it is not discussed for vertical interconnects.

The three TSV fault models are analyzed. The break fault models a full-open defect, as shown in FIG. 23B, and the TSV resistance is modeled as extra resistance, which can be as large as 1 GΩ. The void fault is modeled in a manner similar to the break fault. Instead of imposing the significant resistance change as used in the break model, the resistance increase in the void model is caused by a reduction of the effective conducting area. As a result, it is significantly smaller than the output resistance of a typical driving gate. Therefore, the void faults can be neglected in interposer pre-bond testing.

Figure 24:
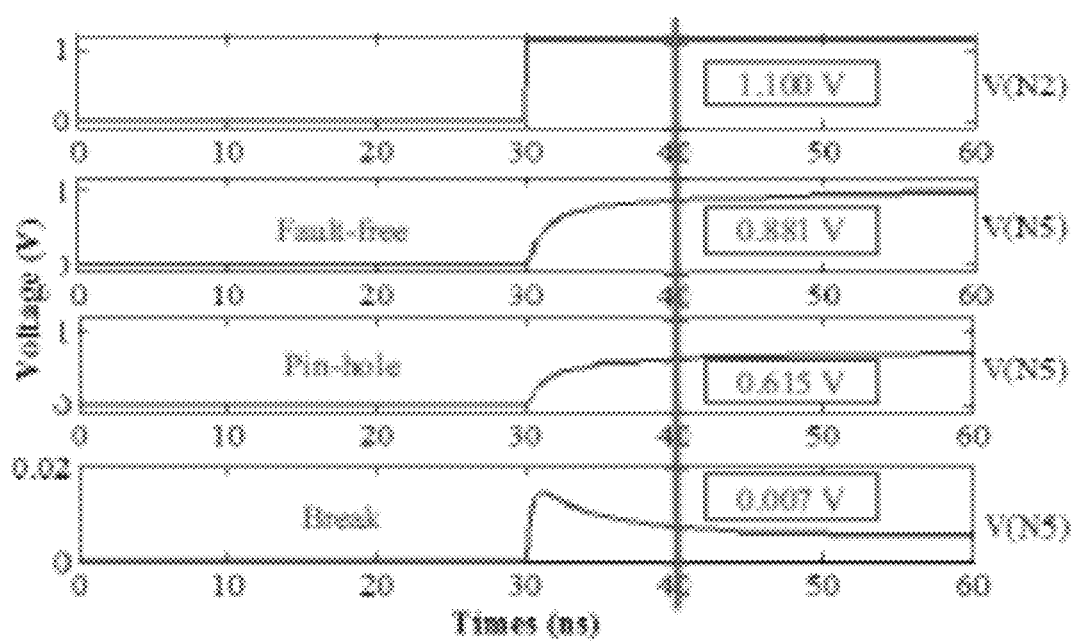
FIG. 24 is a graph of simulation results for fault-free and faulty cases.

The pin-hole fault is modeled as leakage, as shown in FIG. 23C. A leakage resistance $R_{leak}$ is placed in parallel with the TSV capacitance. Meanwhile, the TSV capacitance is also affected by the leakage, resulting in a decreased capacitance. The simulation results for the fault-free and faulty cases are shown in FIG. 24. A low to high transition is applied to N2, and the responses are observed at N5. At 40 ns, the fault-free response is 0.881 V. The responses of the pin-hole and break faults are 0.615 V and 0.007 V, respectively. Therefore, these two faults can be easily detected.

An example commercial interposer was analyzed. This interposer is referred to as X5 herein. Five dies are stacked on the interposer: one ASIC die and four high-bandmemory (HBM) dies. Interconnects are between the ASIC die and each HBM die. Based on data from the manufacturer, the time from applying a test pattern to observing the test response is 25 μs; the time to program e-fuse (te) is 7.5 μs.

Figure 25A:
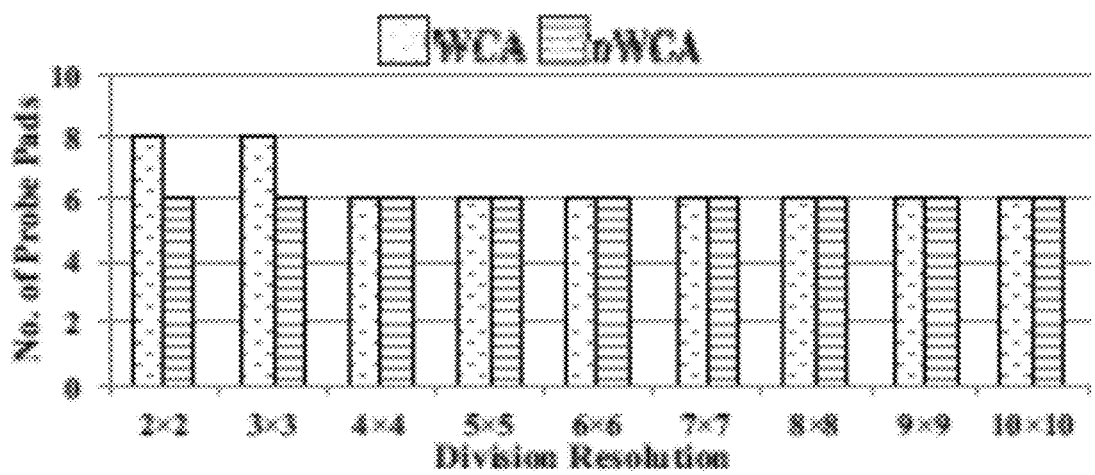
FIGS. 25A and 25B are graphs showing experimental results.
Figure 25B:
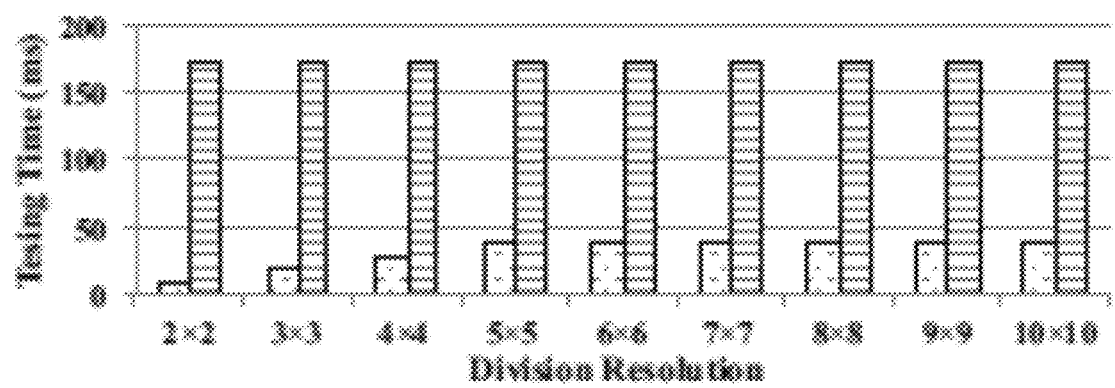

The influence of weighted critical area can be analyzed, where division resolution (n) is varied from 2 to 10. Therefore, the interposer is divided from 2×2 to 10×10 subareas. Then the pre-bond testing is implemented on them. The experimental results are shown in FIGS. 25A and 25B. The number of probe pads for WCA is larger than those for nWCA when n is small because WCA introduces more constraints when test paths are formed. With an increase in n, the constraint is weaker because functional interconnects that are originally in the same area at low resolution are in different areas now; the number of probe pad finally reach the same value for WCA and nWCA. In FIG. 25B, WCA can significantly reduce the testing time, which is at most 20% of that in nWCA. Therefore, it is advisable to include weighted critical area for pre-bond testing.

It is noted that in M3D ICs, two layers can be sequentially fabricated. As a result, the bottom layer may only be tested once the complete M3D IC is fabricated. In order to test the bottom layer, the top layer must be isolated from the bottom layer. When the bottom layer is under test, no signals from the top layer can be transmitted to the bottom layer; the signals to the bottom layer can only be transmitted from the bottom layer itself or from outside the M3D ICs via I/O pads. Note that signals between two layers are transmitted through ILVs. Therefore, these ILVs can be isolated so that signals from the top layer do not affect the testing of the bottom layer. One example solution is to apply a boundary-scan cell for each ILV so that the controllability and observability for the bottom layer can be provided by these BC cells.

With high-density ILVs, if each ILV is equipped with a BC cell, the area overhead may be significantly high. Therefore, the isolation structure may be compatible with high-density integration and also involve low area overhead. In order to achieve this object, a bypass structure as described herein is provided.

Any patents or publications mentioned in this specification are indicative of the levels of those skilled in the art to which the present subject matter pertains. These patents and publications are herein incorporated by reference to the same extent as if each individual publication was specifically and individually indicated to be incorporated by reference.

One skilled in the art will readily appreciate that the present subject matter is well adapted to carry out the objects and obtain the ends and advantages mentioned, as well as those inherent therein. The present examples along with the methods described herein are presently representative of various embodiments, are exemplary, and are not intended as limitations on the scope of the present subject matter. Changes therein and other uses will occur to those skilled in the art which are encompassed within the spirit of the present subject matter as defined by the scope of the claims.

What is claimed is:

1. An integrated circuit comprising:
a plurality of isolation cells;
a first layer comprising first and second sets of electronic components, the first set of electronic components being operatively connected to the second set of electronic components via the isolation cells;
a plurality of transmission gates associated with the isolation cells; and
a second layer comprising electrical circuitry operatively connected to the electronic components of the first layer by a plurality of vias and the transmission gates, the electrical circuitry being configured to apply test patterns to the electronic components of the first layer through the vias and the transmission gates, and the electrical circuitry being configured to receive test responses from the electronic components of the first layer through the vias, wherein the electrical circuitry is configured to control the isolation cells and transmission gates in a predetermined sequence and coordinated with application of test patterns for localized testing of the first and second sets of electronic components.

2. The integrated circuit of claim 1, wherein the isolation cells are electronic fuses.

3. The integrated circuit of claim 2, wherein the electronic fuses are one of gate-electrode-fuses, Cu-fuses, and via-fuses.

4. The integrated circuit of claim 1, wherein the electrical circuitry is configured to control the isolation cells to break electrical connection between the first set of electronic components and the second set of electronic components in accordance with the predetermined sequence.

5. The integrated circuit of claim 4, wherein the isolation cells comprise a first set of isolation cells and a second set of isolation cells,
wherein the test patterns include a first test pattern and a second test pattern,
wherein the electrical circuitry breaks the first isolation cells during test of the first test pattern, and
wherein the electrical circuitry breaks the second isolation cells during test of the second test pattern.

6. The integrated circuit of claim 1, wherein the vias are inter layer vias.

7. The integrated circuit of claim 6, wherein the first layer is a bottom layer, and
wherein the second layer is a top layer.

8. The integrated circuit of claim 1, wherein the first via is an input via of the second layer, and
wherein the integrated circuit further comprises a transmission gate operatively connected to the input via, the transmission gate being configured to prevent input of signals to the at least one electronic component through the input via.

9. The integrated circuit of claim 1, wherein the electrical circuitry is configured to determine areas of fault among the electronic components based on the received test patterns.

10. The integrated circuit of claim 1, further comprising:
launch components configured to input at least a portion of the test patterns to the electronic components; and
capture scan components configured to receive and to output at least a portion of the test responses of the electronic components.

11. A method of testing an integrated circuit, the method comprising:
providing an integrated circuit comprising:
a plurality of isolation cells;
a first layer comprising first and second sets of electronic components, the first set of electronic components being operatively connected to the second set of electronic components via the isolation cells;
a plurality of transmission gates associated with the isolation cells; and
a second layer comprising electrical circuitry operatively connected to the electronic components of the first layer by a plurality of vias and the transmission gates;
using the electrical circuitry to apply test patterns to the electronic components of the first layer through the vias and the transmission gates;
receiving, at the electrical circuitry, test responses from the electronic components of the first layer through the vias;
controlling, by the electrical circuitry, the isolation cells and transmission gates in a predetermined sequence and coordinated with application of test patterns for localized testing of the first and second sets of electronic components.

12. The method of claim 11, wherein the isolation cells are electronic fuses.

13. The method of claim 12, wherein the electronic fuses are one of gate-electrode-fuses, Cu-fuses, and via-fuses.

14. The method of claim 11, wherein using the electrical circuitry to apply test patterns comprises controlling the isolation cells to break electrical connection between the first set of electronic components and the second set of electronic components in accordance with the predetermined sequence.

15. The method of claim 14, wherein the isolation cells comprise a first set of isolation cells and a second set of isolation cells,
wherein using the electrical circuitry to apply test patterns comprises:
using the electrical circuitry to apply a first test pattern and a second test pattern;
using the electrical circuitry to break the first isolation cells during test of the first test pattern; and
using the electrical circuitry to break the second isolation cells during test of the second test pattern.

16. The method of claim 11, wherein the vias are inter layer vias.

17. The method of claim 16, wherein the first layer is a bottom layer, and
wherein the second layer is a top layer.

18. The method of claim 11, wherein the first via is an input via of the second layer,
wherein the integrated circuit further comprises a transmission gate operatively connected to the input via, and
wherein the method further comprises using the transmission gate to prevent input of signals to the at least one electronic component through the input via.

19. The method of claim 11, further comprising determining areas of fault among the electronic components based on the received test patterns.

20. The method of claim 11, further comprising:
launch components configured to input at least a portion of the test patterns to the electronic components; and
capture scan components configured to receive and to output at least a portion of the test responses of the electronic components.

* * * * *